(12) United States Patent
Rathinasamy et al.

(10) Patent No.: US 11,516,936 B2
(45) Date of Patent: Nov. 29, 2022

(54) HYBRID MANAGEMENT SWITCH/CABLING SYSTEM

(71) Applicant: Dell Products L.P., Round Rock, TX (US)

(72) Inventors: Shree Rathinasamy, Round Rock, TX (US); Victor Teeter, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/168,408

(22) Filed: Feb. 5, 2021

(65) Prior Publication Data

US 2022/0256728 A1 Aug. 11, 2022

(51) Int. Cl.
*H05K 7/14* (2006.01)
*G06F 13/42* (2006.01)
*H01R 25/00* (2006.01)
*H01R 27/02* (2006.01)
*H02G 3/04* (2006.01)

(52) U.S. Cl.
CPC ....... *H05K 7/1492* (2013.01); *G06F 13/4282* (2013.01); *H01R 25/003* (2013.01); *H01R 27/02* (2013.01); *G06F 2213/0042* (2013.01); *H01R 2201/04* (2013.01); *H02G 3/0462* (2013.01)

(58) Field of Classification Search
CPC .............. H05K 7/1492; G06F 13/4282; G06F 2213/0042; H01R 25/003; H01R 27/02; H01R 2201/04; H02G 3/0462
USPC ................................. 710/11, 14, 38, 105, 316
See application file for complete search history.

(56) References Cited

U.S. PATENT DOCUMENTS

| | | | | |
|---|---|---|---|---|
| 7,066,754 B2 * | 6/2006 | Beck | ........................ | B41J 29/00 439/314 |
| 8,579,664 B1 * | 11/2013 | Schooley | ................ | H01R 31/06 439/957 |
| 2008/0222312 A1 * | 9/2008 | Simanonis | ............ | G06F 13/409 710/10 |
| 2009/0175283 A1 * | 7/2009 | Jan | ...................... | G06F 13/4045 370/401 |
| 2011/0125601 A1 * | 5/2011 | Carpenter | .......... | G06Q 30/0631 705/26.1 |
| 2017/0364465 A1 * | 12/2017 | Tsukamoto | ......... | G06F 13/4022 |

(Continued)

*Primary Examiner* — Idriss N Alrobaye
*Assistant Examiner* — Henry W Yu
(74) *Attorney, Agent, or Firm* — Joseph Mencher

(57) ABSTRACT

A hybrid management cable includes a cable connector having a first cable sub-connector and a second cable sub-connector, The cable connector connects to a hybrid management switch connector on a hybrid management switch and, in response, engages the first cable sub-connector with a first hybrid management switch sub-connector on the hybrid management switch connector, and engages the second cable sub-connector with a second hybrid management switch sub-connector on the hybrid management switch connector. A cable conduit extends from the cable connector. A first management data transmission medium is connected to the first cable sub-connector, located in the cable conduit, and extends along the length of the cable conduit. A second management data transmission medium is connected to the second cable sub-connector, located in the cable conduit and isolated from the first management data transmission medium, and extends along the length of the cable conduit.

20 Claims, 19 Drawing Sheets

(56) References Cited

U.S. PATENT DOCUMENTS

2018/0302420 A1* 10/2018 Nakanelua .......... H04L 63/1425
2019/0045654 A1*  2/2019 Abbondanzio ...... H05K 7/1494

* cited by examiner

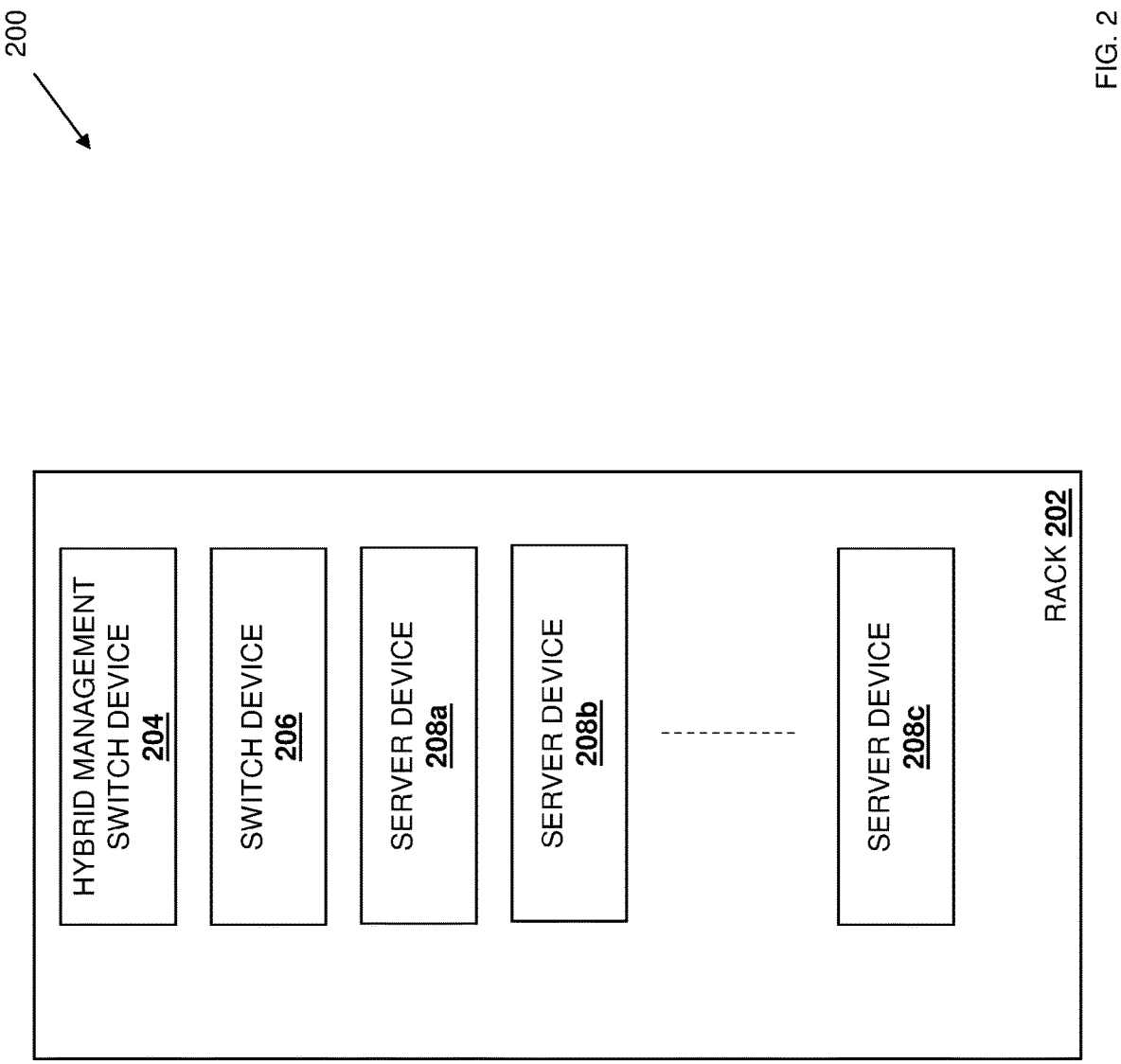

HYBRID MANAGEMENT SWITCH/CABLING SYSTEM

BACKGROUND

The present disclosure relates generally to information handling systems, and more particularly to a hybrid management switch device and hybrid management cabling for information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, storage devices, networking devices, and/or other computing devices known in the art, are often positioned in a rack and cabled together in order to allow those computing devices to communicate with each other and over a network. For example, conventional datacenters often provide racks that may each include one or more server devices and one or more "data network" switch devices that are each coupled to both a Top Of Rack (TOR) Ethernet management switch device that provides Ethernet management connectivity, as well as a TOR console management switch device that provides serial/console management connectivity, and with both the TOR Ethernet management switch device and the TOR console management switch device providing respective out-of-band management connections for the server device(s) and "data network" switch devices that allow for the separation of "management network" data traffic from "data network" data traffic handled by the "data network" switch devices.

As will be appreciated by one of skill in the art in possession of the present disclosure, TOR Ethernet management switch devices provide many more options for managing server devices and "data network" switch devices (e.g., using any protocol available via the operating system) than TOR console management switch devices, but are unavailable during time periods between which those server devices and "data network" switch devices are restarted and their operating system becomes available. Furthermore, while TOR console management switch devices are much more limited in their management options compared to TOR Ethernet management switch devices, they are available as long as the server devices and "data network" switch devices are powered, which allows for management (e.g., troubleshooting) of those server devices and "data network" switch devices during time periods between which those server devices and "data network" switch devices are restarted and their operating system becomes available (i.e., when TOR Ethernet management switch devices are unavailable). As such, each of the server device(s) and "data network" switch device(s) in a rack are provided with separate cabling to each of the TOR Ethernet management switch device and the TOR console management switch device in that rack, which can raise some issues.

For example, one of skill in the art will appreciate that the separate cabling provided for each server device and "data network" switch device in a rack to both the TOR Ethernet management switch device and the TOR console management switch device in that rack increases the amount of cabling provided in the rack, which increase cabling costs, complicates cable routing, uses up cable routing space in the rack, presents difficulties when determining how devices are cabled together in the rack, reduces the ability to cool devices in the rack (i.e., due to the cabling blocking airflow paths), obstructs access to devices and other components (e.g., status lights, ports, etc.) in the rack, and presents a variety of other issues known in the art. Furthermore, the use of multiple management switch devices in a rack requires the utilization of multiple device slots in the rack that could otherwise be utilized for additional server devices and/or "data network" switch devices.

Accordingly, it would be desirable to provide a management switch/cabling system that addresses the issues discussed above.

SUMMARY

According to one embodiment, an Information Handling System (IHS) includes a processing system; a hybrid management switch connector that is coupled to the processing system and that includes a first hybrid management switch sub-connector and a second hybrid management switch sub-connector; a first cable connector including a first cable sub-connector and a second cable sub-connector, wherein the first cable connector is connected to the hybrid management switch connector to engage the first cable sub-connector with the first hybrid management switch sub-connector, and engage the second cable sub-connector with the second hybrid management switch sub-connector; a cable conduit extending from the first cable connector; a first management data transmission medium that is connected to the first cable sub-connector, that is located in the cable conduit, and that extends along the length of the cable conduit; and a second management data transmission medium, that is connected to the second cable sub-connector, that is located in the cable conduit and isolated from the first management data transmission medium, and that extends along the length of the cable conduit.

BRIEF DESCRIPTION OF THE DRAWINGS

FIG. 2 is a schematic view illustrating an embodiment of a hybrid management switch system.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
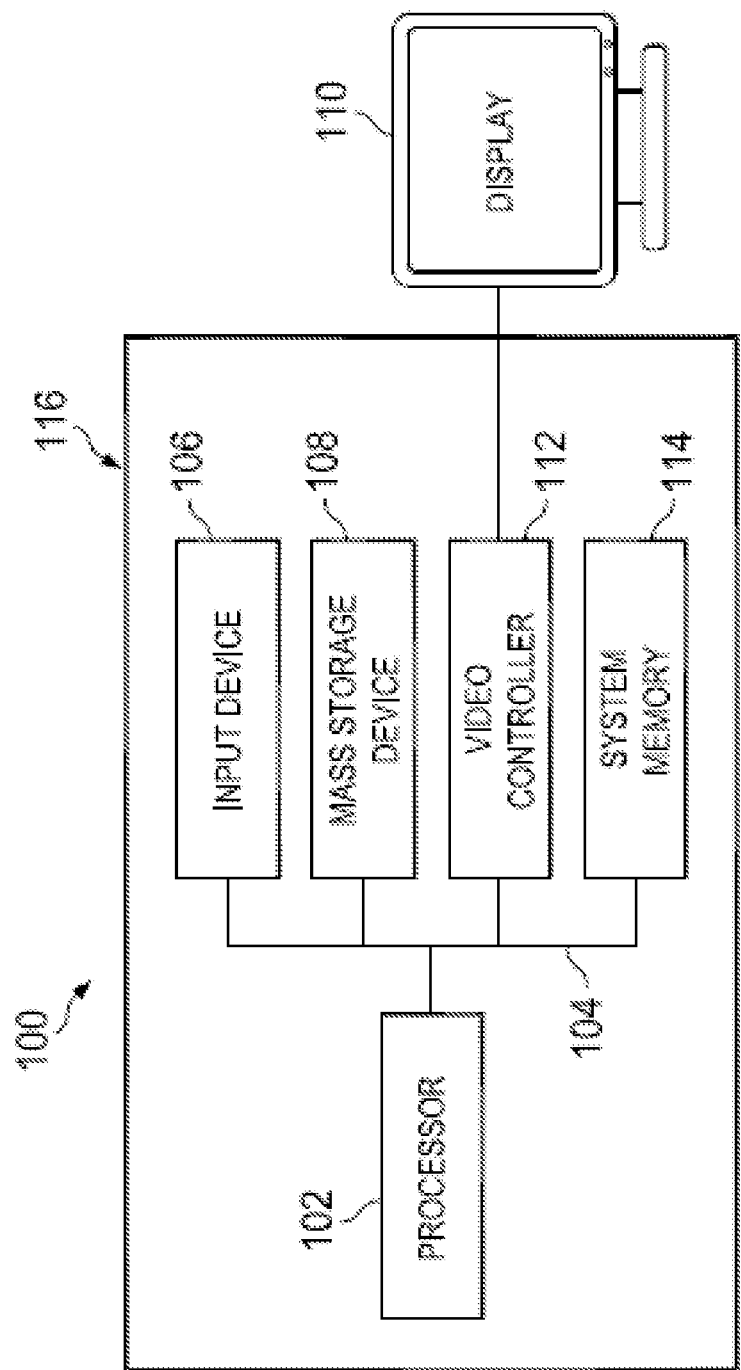
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIG. 2, an embodiment of a hybrid management switch system 200 is illustrated. In the illustrated embodiment, the hybrid management switch system 200 includes a rack 202 that may be provided by any structure that one of skill in the art in possession of the present disclosure would recognize as supporting the devices described below. A hybrid management switch device 204 is positioned in the rack 202. In an embodiment, the hybrid management switch device 204 may be provided by the IHS 100 discussed above with reference to FIG. 1, and/or may include some or all of the components of the IHS 100, and in the specific examples discussed below is configured to provide both Ethernet management connectivity and serial/console management connectivity to other devices included in the rack 202, discussed in further detail below. However, while illustrated and discussed as being provided by a switch device, one of skill in the art in possession of the present disclosure will recognize that the hybrid management switch device 204 in the hybrid management switch system 200 may be provided by any devices that may be configured to operate similarly as the hybrid management switch device 204 discussed below.

In the illustrated embodiment, a switch device 206 is positioned in the rack 202. In an embodiment, the switch device 206 may be provided by the IHS 100 discussed above with reference to FIG. 1, and/or may include some or all of the components of the IHS 100, and in the specific examples discussed below is described as a "data network" switch device that connects other devices included in the rack 202 to a data network that is different than management networks that may be connected to via the hybrid management switch device 204, discussed in further detail below. However, while illustrated and discussed as being provided by a switch device, one of skill in the art in possession of the present disclosure will recognize that the switch device 206 in the hybrid management switch system 200 may be provided by any devices that may be configured to operate similarly as the switch device 206 discussed below. In the illustrated embodiment, a plurality of server devices 208a, 208b, and up to 208c are positioned in the rack 202. In an embodiment, any or all of the server devices 208a-208c may be provided by the IHS 100 discussed above with reference to FIG. 1, and/or may include some or all of the components of the IHS 100. However, while illustrated and discussed as being provided by server devices, one of skill in the art in possession of the present disclosure will recognize that any or all of the server devices 208a-208b in the hybrid management switch system 200 may be provided by other devices (e.g., storage devices/systems) that may be configured to operate similarly as the server devices 208a-208c discussed below. Furthermore, while a specific hybrid management switch system 200 has been illustrated and described, one of skill in the art in possession of the present disclosure will recognize that the hybrid management switch system of the present disclosure may include a variety of components and component configurations while remaining within the scope of the present disclosure as well.

Figure 3A:
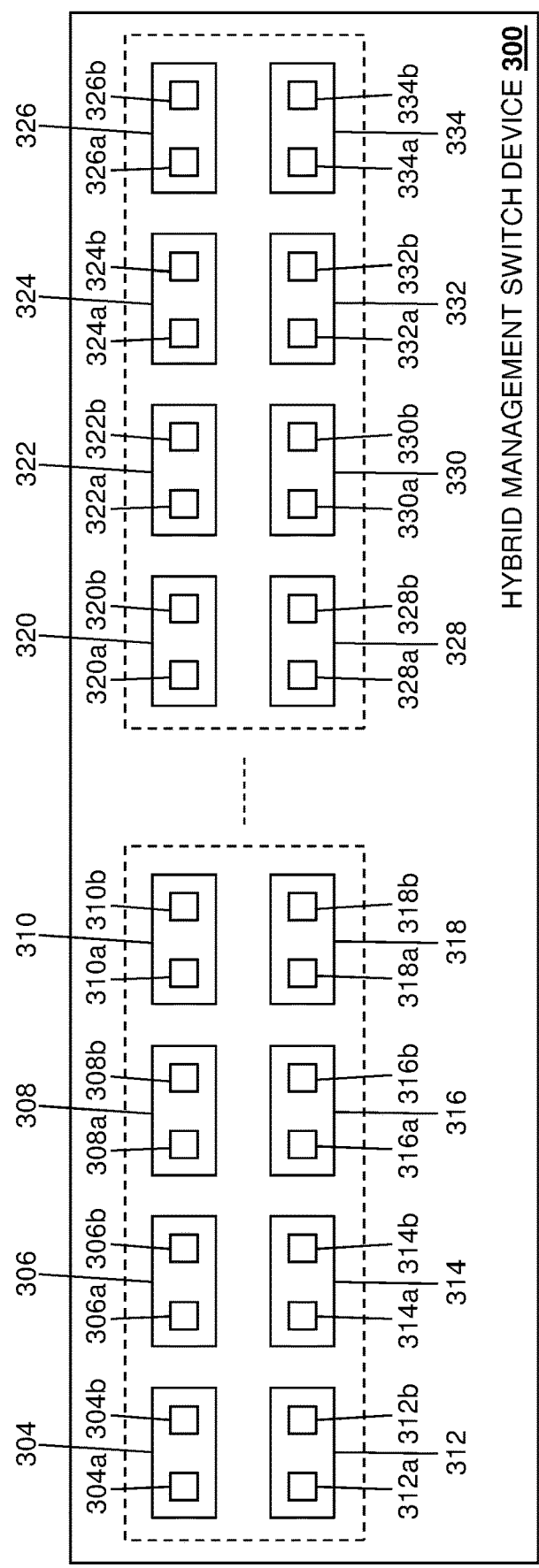
FIG. 3A is a schematic view illustrating an embodiment of a hybrid management switch device that may be provided in the hybrid management switch system of FIG. 2.
Figure 3B:
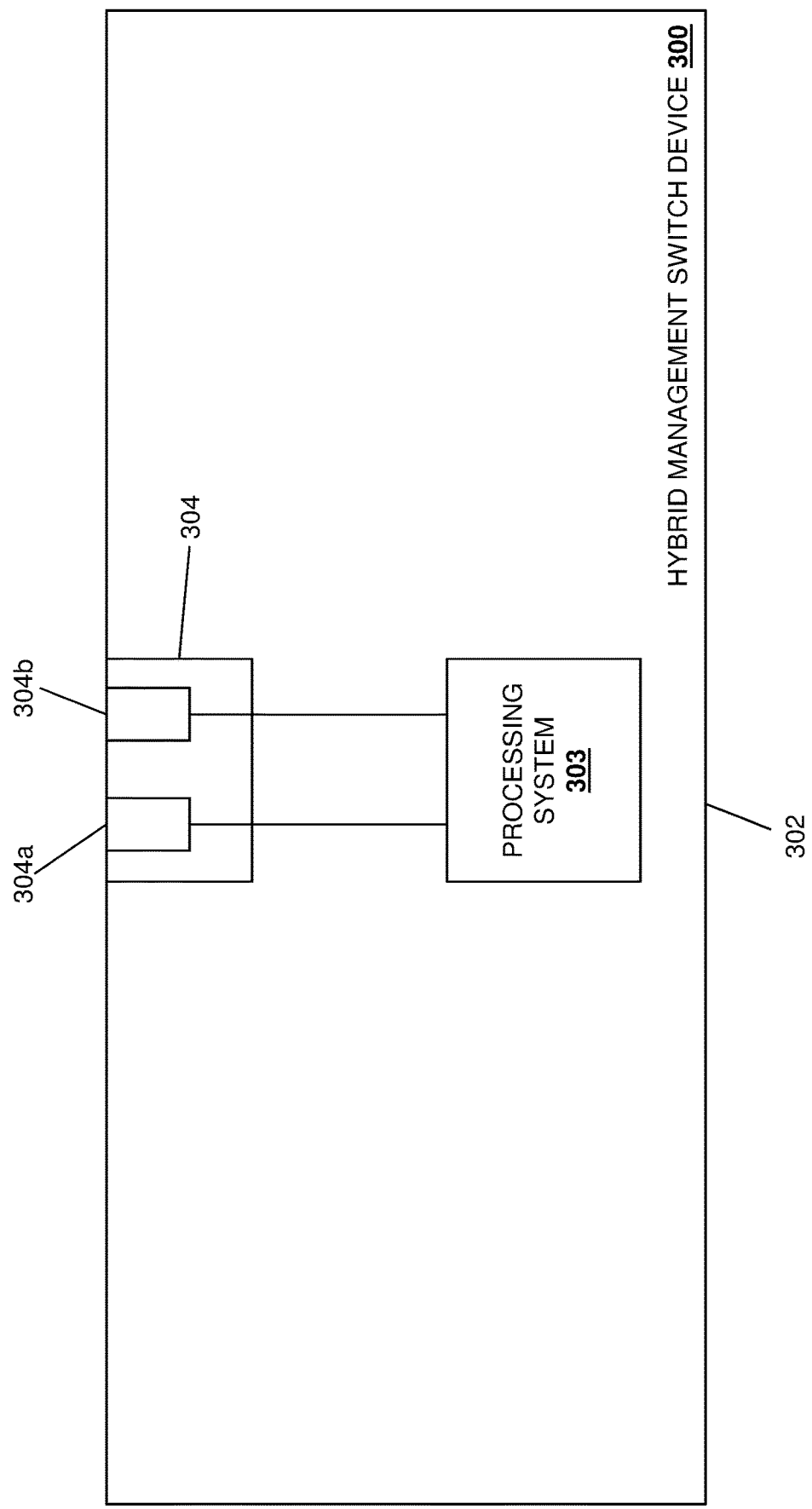
FIG. 3B is a schematic view illustrating an embodiment of the hybrid management switch device of FIG. 3A.

Referring now to FIGS. 3A and 3B, an embodiment of a hybrid management switch device 300 is illustrated that may provide the hybrid management switch device 204 discussed above with reference to FIG. 2. As such, the hybrid management switch device 204 may be provided by the IHS 100 discussed above with reference to FIG. 1 and/or may include some or all of the components of the IHS 100, and in specific examples may be configured to provide both Ethernet management connectivity and serial/console management connectivity to other devices. Furthermore, while illustrated and discussed as being provided by a switch device, one of skill in the art in possession of the present disclosure will recognize that the functionality of the hybrid management switch device 300 discussed below may be provided by other devices that are configured to operate similarly as the hybrid management switch device 300 discussed below.

In the illustrated embodiment, the hybrid management switch device 300 includes a chassis 302 that houses the components of the hybrid management switch device 300, only some of which are illustrated below. For example, the chassis 302 may house a processing system 303 (which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to process Ethernet management communications and serial/console management communications, as discussed in further detail below. In a specific example, the processing system 303 may be provided by a switch Application Specific Integrated Circuit (ASIC) that performs Universal Asynchronous Receiver/Transmitter (UART) functionality, although one of skill in the art in possession of the present disclosure will recognize that other processing systems providing other functionality will fall within the scope of the present disclosure as well.

The chassis 302 may also house a communication system that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure, and that in FIGS. 3A and 3B is illustrated as including hybrid management switch connectors that each include a pair of hybrid management switch sub-connectors. For example, FIG. 3A illustrates a hybrid management switch connector 304 with hybrid management switch sub-connectors 304a and 304b, a hybrid management switch connector 306 with hybrid management switch sub-connectors 306a and 306b, and up to a hybrid management switch connector 334 with hybrid management switch sub-connectors 334a and 334b. FIG. 3B illustrates how each of the hybrid management switch sub-connectors 304a and 304b on the hybrid management switch connector 304 may each be coupled to the processing system 303 and, while not illustrated, one of skill in the art in possession of the present disclosure will appreciate how the hybrid management switch sub-connectors 306a and 306b on the hybrid management switch connector 306 and up to the hybrid management switch sub-connectors 334a and 334b on the hybrid management switch connector 334 may each be coupled to the processing system 303 in a similar manner as well.

In the specific examples provided below, the hybrid management switch sub-connectors 304a, 306a, and up to 334a on the hybrid management switch connectors 304, 306, and up to 334, respectively, may be provided by Ethernet connectors that are configured to transmit the Ethernet management data discussed below, while the hybrid management switch sub-connectors 304b, 306b, and up to 334b on the hybrid management switch connectors 304, 306, and up to 334, respectively, may be provided by Ethernet connectors that are configured to transmit the serial/console management data discussed below. However, while particular connector technology is described as being provided for the hybrid management switch sub-connectors above, one of skill in the art in possession of the present disclosure will appreciate that different connector technology may be utilized for either or both of the hybrid management switch sub-connectors on each hybrid management switch connector while remaining within the scope of the present disclosure as well. For example, either or both of the Ethernet connectors providing each of the hybrid management switch sub-connectors on each hybrid management switch connector discussed above may be replaced by a Fibre Optic connector while remaining within the scope of the present disclosure as well. Furthermore, while a specific hybrid management switch device 300 has been illustrated, one of skill in the art in possession of the present disclosure will recognize that hybrid management switch devices (or other devices operating according to the teachings of the present disclosure in a manner similar to that described below for the hybrid management switch device 300) may include a variety of components and/or component configurations for providing conventional management switch device functionality, as well as the functionality discussed below, while remaining within the scope of the present disclosure as well.

Figure 4A:
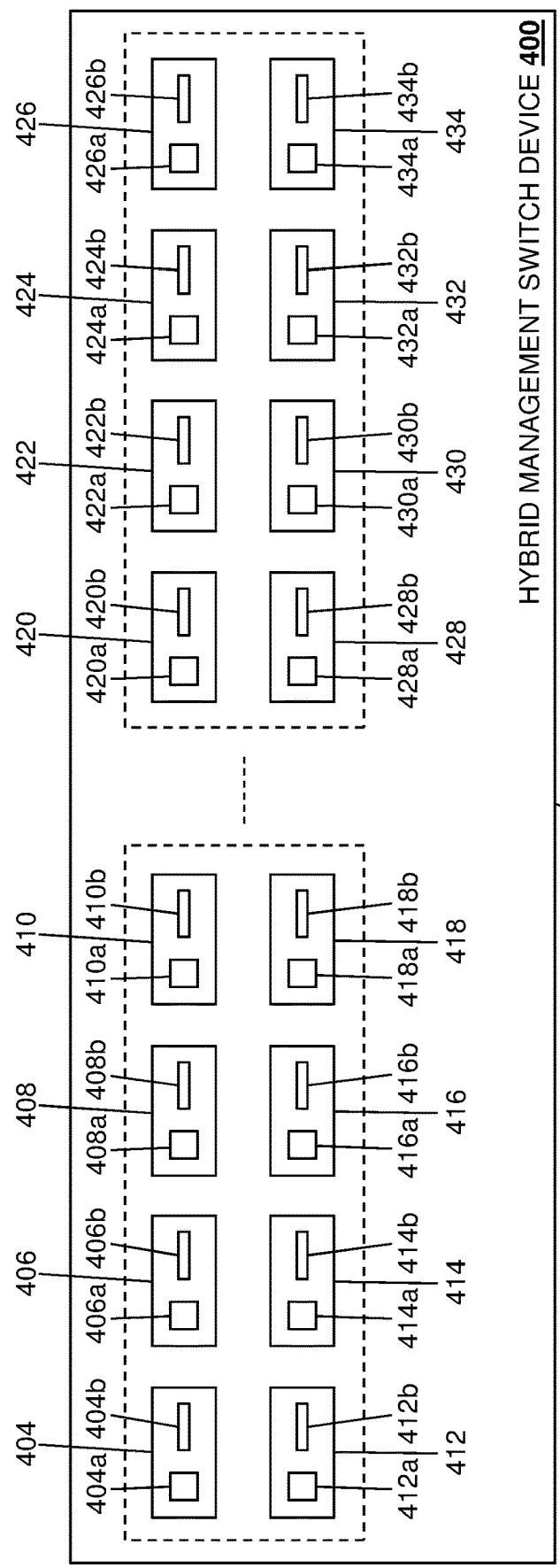
FIG. 4A is a schematic view illustrating an embodiment of a hybrid management switch device that may be provided in the hybrid management switch system of FIG. 2.
Figure 4B:
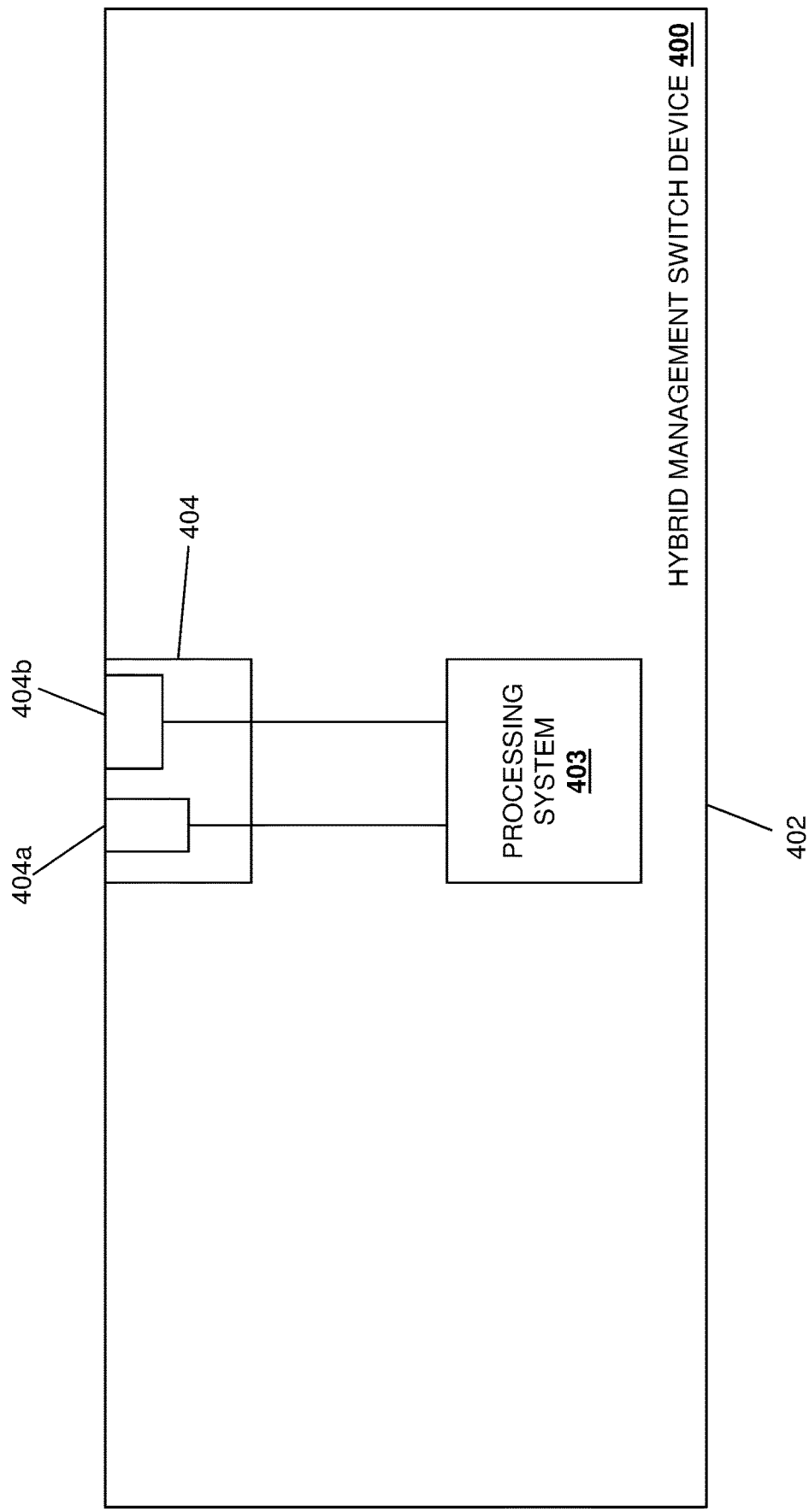
FIG. 4B is a schematic view illustrating an embodiment of the hybrid management switch device of FIG. 4A.

Referring now to FIGS. 4A and 4B, an embodiment of a hybrid management switch device 400 is illustrated that may provide the hybrid management switch device 204 discussed above with reference to FIG. 2. As such, the hybrid management switch device 204 may be provided by the IHS 100 discussed above with reference to FIG. 1 and/or may include some or all of the components of the IHS 100, and in specific examples may be configured to provide both Ethernet management connectivity and serial/console management connectivity to other devices. Furthermore, while illustrated and discussed as being provided by a switch device, one of skill in the art in possession of the present disclosure will recognize that the functionality of the hybrid management switch device 400 discussed below may be provided by other devices that are configured to operate similarly as the hybrid management switch device 400 discussed below.

In the illustrated embodiment, the hybrid management switch device 400 includes a chassis 402 that houses the components of the hybrid management switch device 400, only some of which are illustrated below. For example, the chassis 402 may house a processing system 403 (which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to process Ethernet management communications and serial/console management communications, as discussed in further detail below. In a specific example, the processing system 403 may be provided by a switch ASIC that performs UART functionality, although one of skill in the art in possession of the present disclosure will recognize that other processing systems providing other functionality will fall within the scope of the present disclosure as well.

The chassis 402 may also house a communication system that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure, and that in FIGS. 4A and 4B is illustrated as including hybrid management switch connectors that each include a pair of hybrid management switch sub-connectors. For example, FIG. 4A illustrates a hybrid management switch connector 404 with hybrid management switch sub-connectors 404a and 404b, a hybrid management switch connector 406 with hybrid management switch sub-connectors 406a and 406b, and up to a hybrid management switch connector 434 with hybrid management switch sub-connectors 434a and 434b. FIG. 4B illustrates how each of the hybrid management switch sub-connectors 404a and 404b on the hybrid management switch connector 404 may each be coupled to the processing system 403 and, while not illustrated, one of skill in the art in possession of the present disclosure will appreciate how the hybrid management switch sub-connectors 406a and 406b on the hybrid management switch connector 406 and up to the hybrid management switch sub-connectors 434a and 434b on the hybrid management switch connector 434 may each be coupled to the processing system 403 in a similar manner as well.

In the specific examples provided below, the hybrid management switch sub-connectors 404a, 406a, and up to 434a on the hybrid management switch connectors 404, 406, and up to 434, respectively, may be provided by Ethernet connectors that are configured to transmit the Ethernet management data discussed below, while the hybrid management switch sub-connectors 404b, 406b, and up to 434b on the hybrid management switch connectors 404, 406, and up to 434, respectively, may be provided by Universal Serial Bus (USB) connectors (e.g., USB type-A, USB type-B, USB type-C, etc.) that are configured to transmit the serial/console management data discussed below. However, while particular connector technology is described as being provided for the hybrid management switch sub-connectors above, one of skill in the art in possession of the present disclosure will appreciate that different connector technology may be utilized for either or both of the hybrid management switch sub-connectors on each hybrid management switch connector while remaining within the scope of the present disclosure as well. For example, the Ethernet connectors providing the hybrid management switch sub-connectors on the hybrid management switch connectors discussed above may be replaced by Fibre Optic connectors while remaining within the scope of the present disclosure as well. Furthermore, while a specific hybrid management switch device 400 has been illustrated, one of skill in the art in possession of the present disclosure will recognize that hybrid management switch devices (or other devices operating according to the teachings of the present disclosure in a manner similar to that described below for the hybrid management switch device 400) may include a variety of components and/or component configurations for providing conventional management switch device functionality, as well as the functionality discussed below, while remaining within the scope of the present disclosure as well.

Figure 5A:
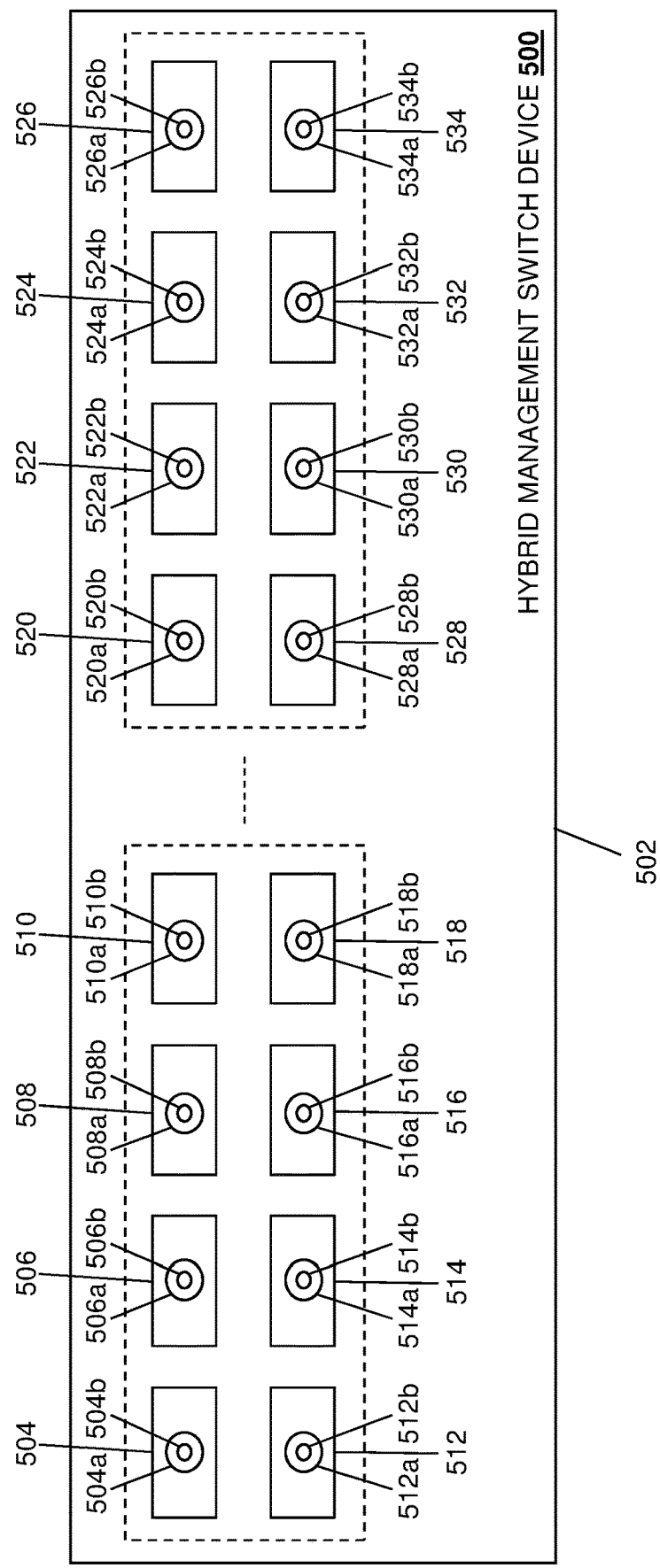
FIG. 5A is a schematic view illustrating an embodiment of a hybrid management switch device that may be provided in the hybrid management switch system of FIG. 2.
Figure 5B:
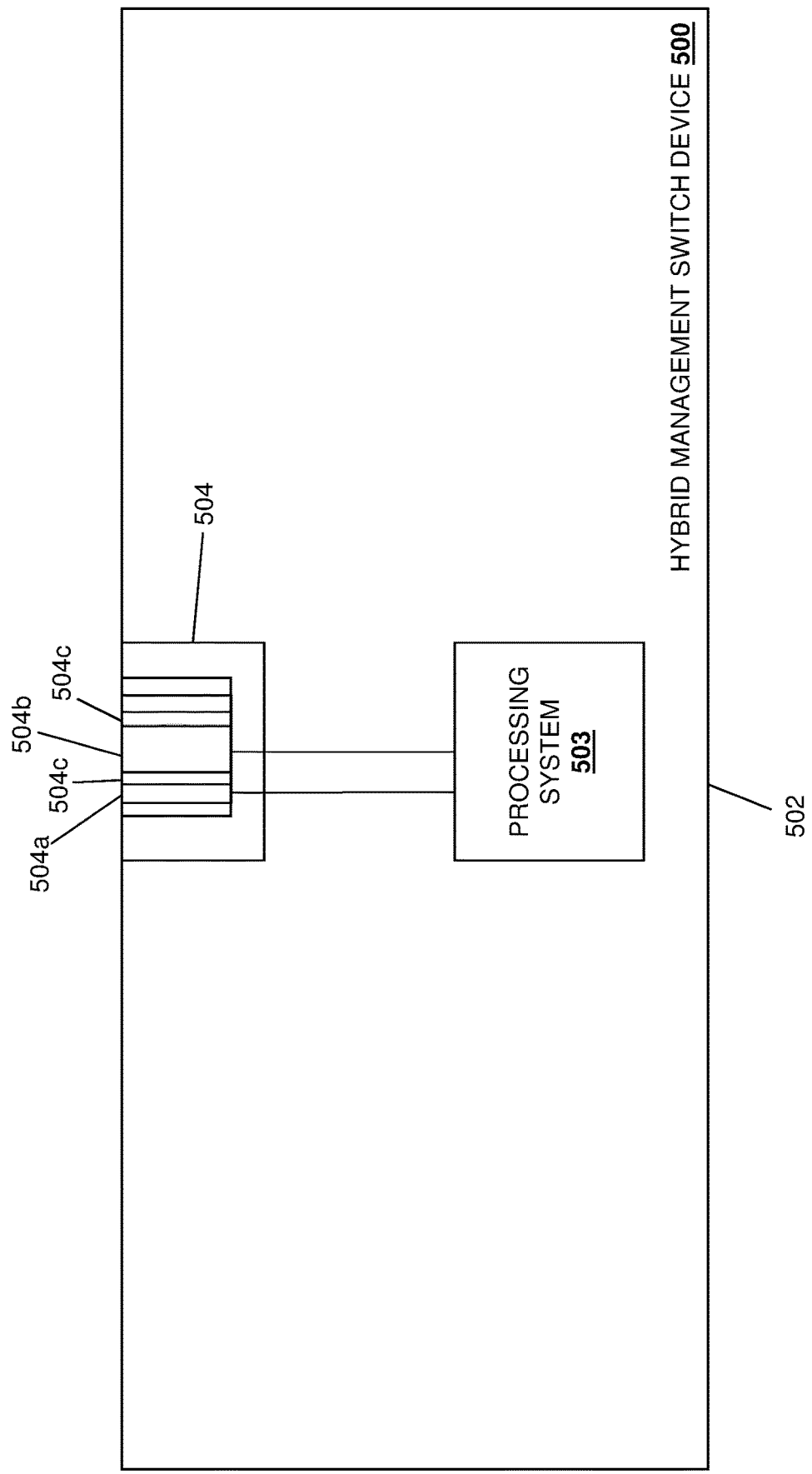
FIG. 5B is a schematic view illustrating an embodiment of the hybrid management switch device of FIG. 5A.

Referring now to FIGS. 5A and 5B, an embodiment of a hybrid management switch device 500 is illustrated that may provide the hybrid management switch device 204 discussed above with reference to FIG. 2. As such, the hybrid management switch device 204 may be provided by the IHS 100 discussed above with reference to FIG. 1 and/or may include some or all of the components of the IHS 100, and in specific examples may be configured to provide both Ethernet management connectivity and serial/console management connectivity to other devices. Furthermore, while illustrated and discussed as being provided by a switch device, one of skill in the art in possession of the present disclosure will recognize that the functionality of the hybrid management switch device 500 discussed below may be provided by other devices that are configured to operate similarly as the hybrid management switch device 500 discussed below.

In the illustrated embodiment, the hybrid management switch device 500 includes a chassis 502 that houses the components of the hybrid management switch device 500, only some of which are illustrated below. For example, the chassis 502 may house a processing system 503 (which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to process Ethernet management communications and serial/console management communications, as discussed in further detail below. In a specific example, the processing system 503 may be provided by a switch ASIC that performs UART functionality, although one of skill in the art in possession of the present disclosure will recognize that other processing systems providing other functionality will fall within the scope of the present disclosure as well.

The chassis 502 may also house a communication system that may be provided by a Network Interface Controller (NIC), wireless communication systems (e.g., BLUETOOTH®, Near Field Communication (NFC) components, WiFi components, etc.), and/or any other communication components that would be apparent to one of skill in the art in possession of the present disclosure, and that in FIGS. 5A and 5B is illustrated as including hybrid management switch connectors that each include a pair of hybrid management switch sub-connectors. For example, FIG. 5A illustrates a hybrid management switch connector 504 with hybrid management switch sub-connectors 504a and 504b, a hybrid management switch connector 506 with hybrid management switch sub-connectors 506a and 506b, and up to a hybrid management switch connector 534 with hybrid management switch sub-connectors 534a and 534b. FIG. 5B illustrates how each of the hybrid management switch sub-connectors 504a and 504b on the hybrid management switch connector 504 may each be coupled to the processing system 503 and, while not illustrated, one of skill in the art in possession of the present disclosure will appreciate how the hybrid management switch sub-connectors 506a and 506*b* on the hybrid management switch connector 506 and up to the hybrid management switch sub-connectors 534*a* and 534*b* on the hybrid management switch connector 534 may each be coupled to the processing system 503 in a similar manner as well.

In the specific examples provided below, the hybrid management switch sub-connectors 504*a*, 506*a*, and up to 534*a* on the hybrid management switch connectors 504, 506, and up to 534, respectively, may be provided by tubular connectors that are configured to transmit the Ethernet management data discussed below, while the hybrid management switch sub-connectors 504*b*, 506*b*, and up to 534*b* on the hybrid management switch connectors 504, 506, and up to 534, respectively, may be provided by cylindrical connectors that positioned within the respective tubular connectors that provide the hybrid management switch sub-connectors 504*a*, 506*a*, and up to 534*a*, respectively, and that are configured to transmit the serial/console management data discussed below. Furthermore, FIG. 5B illustrates how the tubular connector that provides the hybrid management switch sub-connector 504*a* is separated from the cylindrical connector that provides the hybrid management switch sub-connector 504*b* by a tubular insulator 504*c*, and one of skill in the art in possession of the present disclosure will appreciate how the hybrid management switch connectors 506 and up to 534 may include similar tubular insulators as well. However, while a specific hybrid management switch device 500 has been illustrated, one of skill in the art in possession of the present disclosure will recognize that hybrid management switch devices (or other devices operating according to the teachings of the present disclosure in a manner similar to that described below for the hybrid management switch device 500) may include a variety of components and/or component configurations for providing conventional management switch device functionality, as well as the functionality discussed below, while remaining within the scope of the present disclosure as well.

Figure 6:
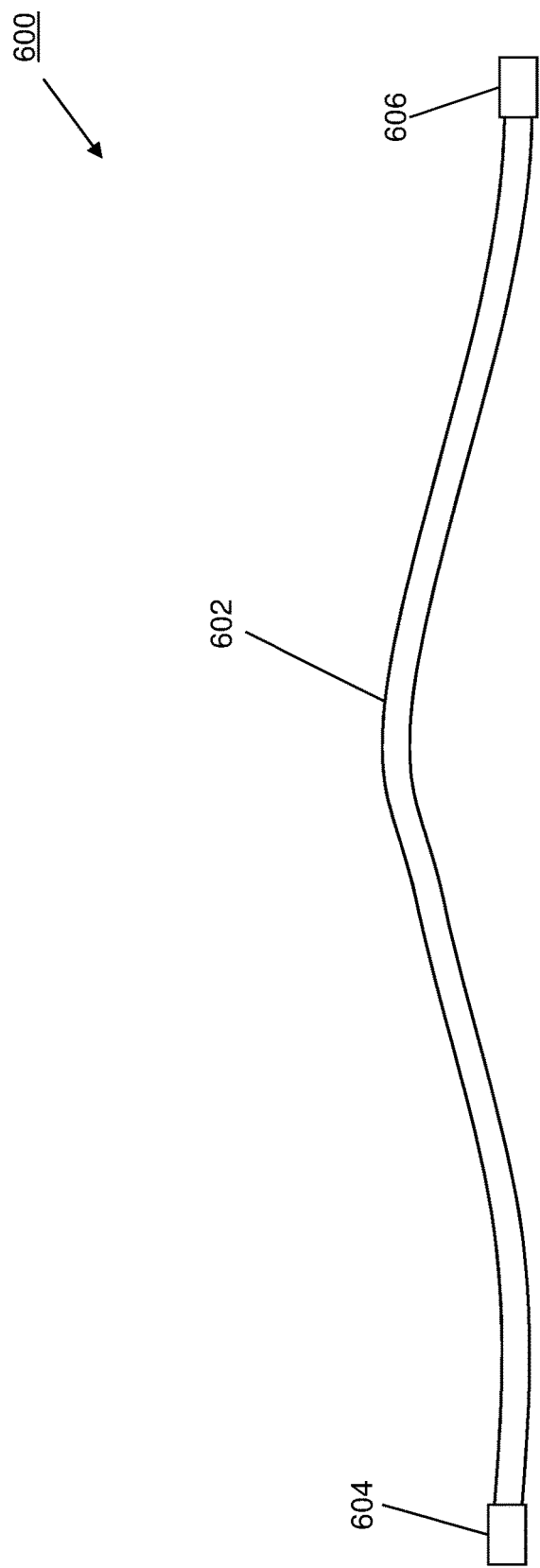
FIG. 6 is a schematic view illustrating an embodiment of a hybrid management cable that may be provided in the hybrid management switch system of FIG. 2.

Referring now to FIG. 6, an embodiment of a hybrid management cable 600 is illustrated that may be utilized in the hybrid management switch system 200 discussed above with reference to FIG. 2. In the illustrated embodiment, the hybrid management cable 600 includes a cable conduit 602 that may be provided in a variety of cable lengths that would be apparent to one of skill in the art in possession of the present disclosure, and a pair of cable connectors 604 and 606 that are located on opposite ends of the cable conduit 602. As discussed in further detail below, the cable connectors 604 and 606 may each include a pair of cable sub-connectors that may be provided using different connector technology in different embodiments, a few of which are described below. Furthermore, one of skill in the art in possession of the present disclosure will appreciate that the hybrid management cable 600 described herein provides an example of a hybrid management cable that may be utilized with the switch device 206 and server devices 208*a*-208*c* that are provided with the hybrid managed device connectors of the present disclosure.

Figure 7A:
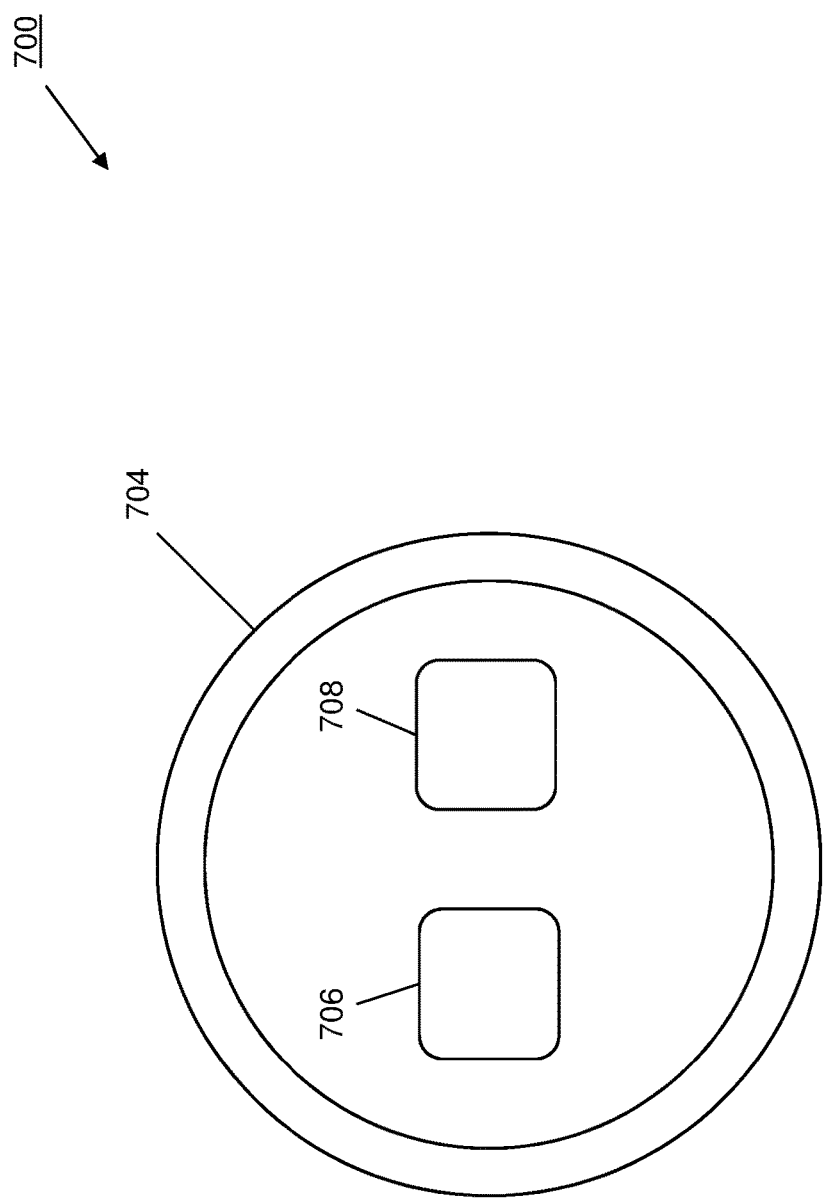
FIG. 7A is a schematic view illustrating an embodiment of the hybrid management cable of FIG. 6.
Figure 7B:
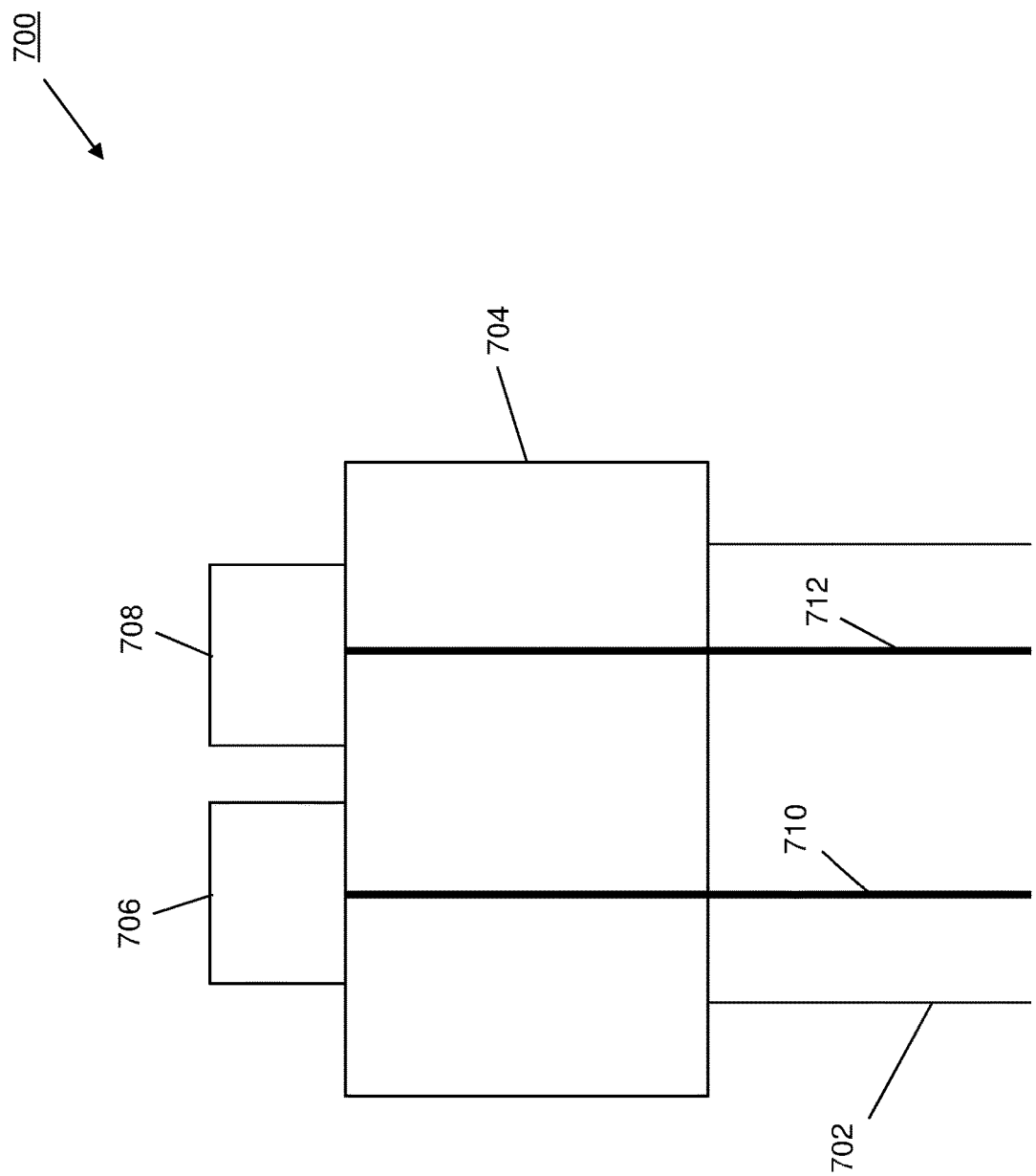
FIG. 7B is a schematic view illustrating an embodiment of the hybrid management cable of FIG. 6.

With reference to FIGS. 7A and 7B, an embodiment of a hybrid management cable 700 is illustrated that may provide the hybrid management cable 600 discussed above with reference to FIG. 6. The hybrid management cable 700 includes a cable conduit 702 that may be the cable conduit 602 discussed above with reference to FIG. 6, and a cable connector 704 that may provide either of the cable connectors 604 and 606 discussed above with reference to FIG. 6. Furthermore, FIGS. 7A and 7B illustrate how the cable connector 704 may include a pair of cable sub-connectors 706 and 708, with a management data transmission medium 710 connected to the cable sub-connector 706 and extending through the cable conduit 702 along the length of the cable conduit 702, and a management data transmission medium 712 connected to the cable sub-connector 708 and extending through the cable conduit 702 along the length of the cable conduit 702. While not illustrated, one of skill in the art in possession of the present disclosure will recognize how the management data transmission mediums 710 and 712 may connect to corresponding cable sub-connectors on a cable connector that is included on the cable conduit 702 opposite the cable connector 704.

In the specific examples provided below, the cable sub-connector 706 may be provided by an Ethernet connector that is configured to transmit the Ethernet management data discussed below via its connected management data transmission medium 710 (e.g., copper wiring in this example) and to the corresponding cable sub-connector on the opposite end the cable conduit 702, while the cable sub-connector 708 may be provided by an Ethernet connector that is configured to transmit the serial/console management data discussed below via its connected management data transmission medium 712 (e.g., copper wiring in this example) and to the corresponding cable sub-connector on the opposite end the cable conduit 702. However, while particular connector technology is described as being provided for the cable sub-connectors above, one of skill in the art in possession of the present disclosure will appreciate that different connector technology may be utilized for either or both of the cable sub-connectors on the cable connectors while remaining within the scope of the present disclosure as well. For example, either or both of the Ethernet connectors providing each of the cable sub-connectors on each cable connector discussed above may be replaced by a Fibre Optic connector (with its connected management data transmission medium provided by optical cabling) while remaining within the scope of the present disclosure as well.

Figure 8A:
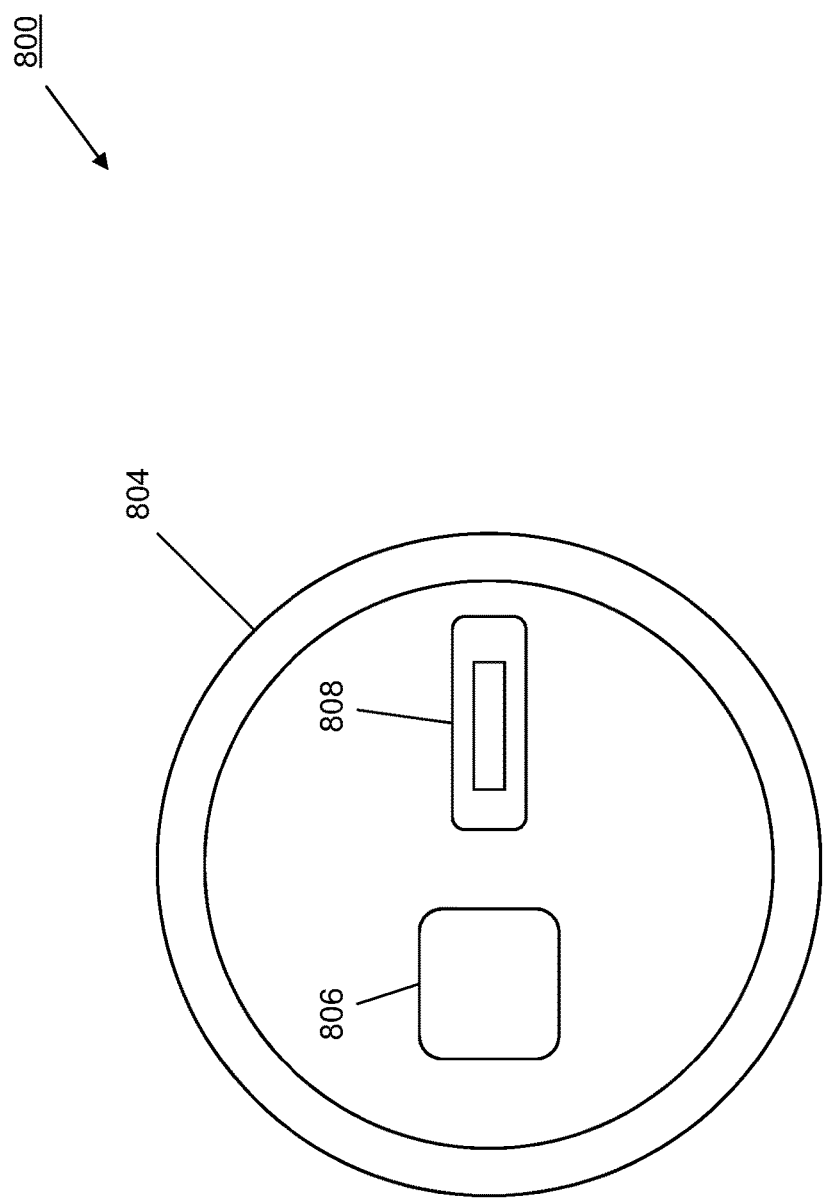
FIG. 8A is a schematic view illustrating an embodiment of the hybrid management cable of FIG. 6.
Figure 8B:
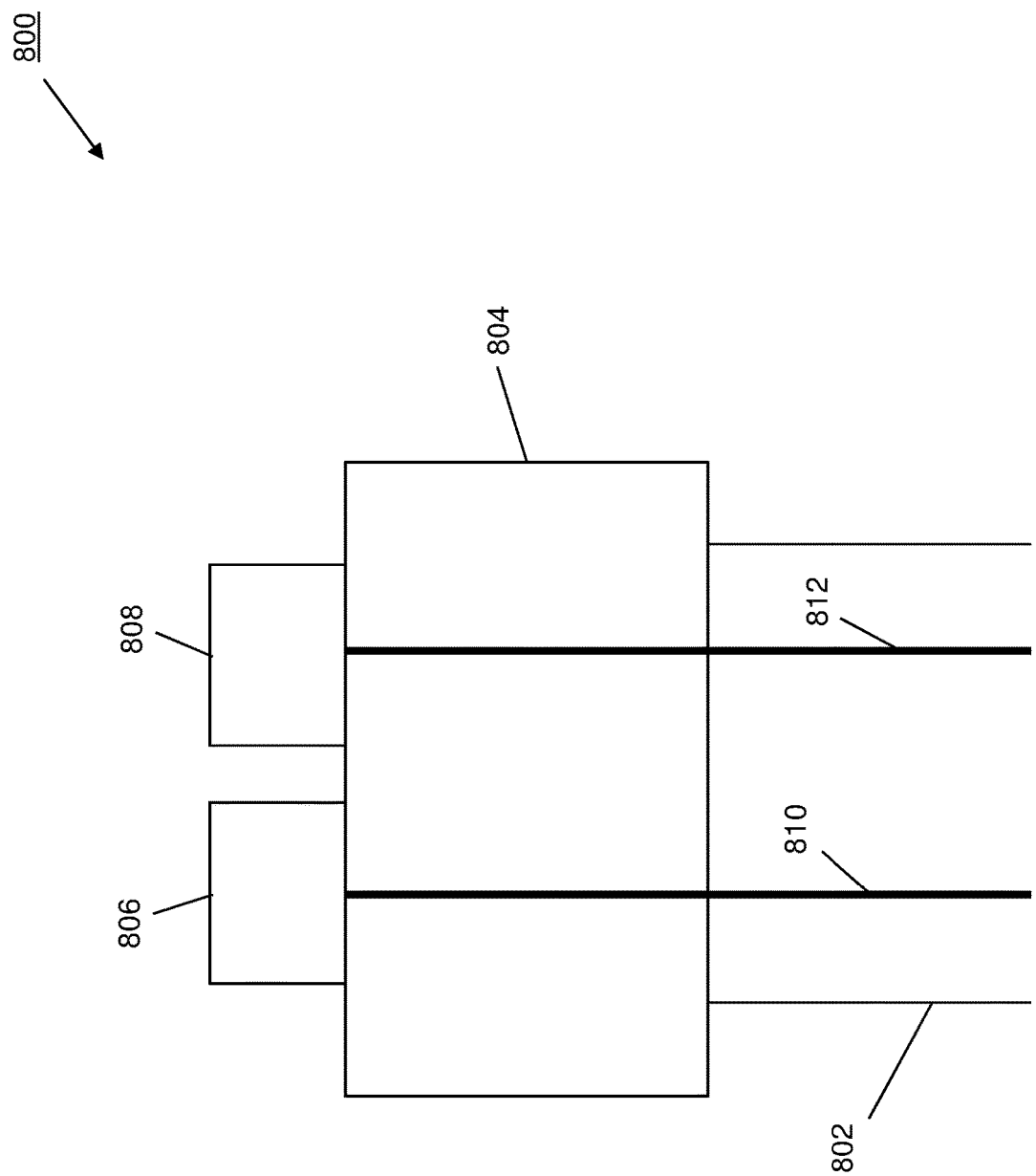
FIG. 8B is a schematic view illustrating an embodiment of the hybrid management cable of FIG. 6.

With reference to FIGS. 8A and 8B, an embodiment of a hybrid management cable 800 is illustrated that may provide the hybrid management cable 600 discussed above with reference to FIG. 6. The hybrid management cable 800 includes a cable conduit 802 that may be the cable conduit 602 discussed above with reference to FIG. 6, and a cable connector 804 that may provide either of the cable connectors 604 and 606 discussed above with reference to FIG. 6. Furthermore, FIGS. 8A and 8B illustrate how the cable connector 804 may include a pair of cable sub-connectors 806 and 808, with a management data transmission medium 810 connected to the cable sub-connector 806 and extending through the cable conduit 802 along the length of the cable conduit 802, and a management data transmission medium 812 connected to the cable sub-connector 808 and extending through the cable conduit 802 along the length of the cable conduit 802. While not illustrated, one of skill in the art in possession of the present disclosure will recognize how the management data transmission mediums 810 and 812 may connect to corresponding cable sub-connectors on a cable connector that is included on the cable conduit 802 opposite the cable connector 804.

In the specific examples provided below, the cable sub-connector 806 may be provided by an Ethernet connector that is configured to transmit the Ethernet management data discussed below via its connected management data transmission medium 810 (e.g., copper wiring in this example) and to the corresponding cable sub-connector on the opposite end of the cable conduit 802, while the cable sub-connector 808 may be provided by an Universal Serial Bus (USB) connector (e.g., USB type-A, USB type-B, USB type-C, etc.) that is configured to transmit the serial/console management data discussed below via its connected management data transmission medium 812 (e.g., copper wiring in this example) and to the corresponding cable sub-connector on the opposite end of the cable conduit 802. However, while particular connector technology is described as being provided for the cable sub-connectors above, one of skill in the art in possession of the present disclosure will appreciate that different connector technology may be utilized for either or both of the cable sub-connectors on the cable connectors while remaining within the scope of the present disclosure as well. For example, the Ethernet connector providing the cable sub-connectors on each cable connector discussed above may be replaced by a Fibre Optic connector (with its connected management data transmission medium provided by optical cabling) while remaining within the scope of the present disclosure as well.

Figure 9A:
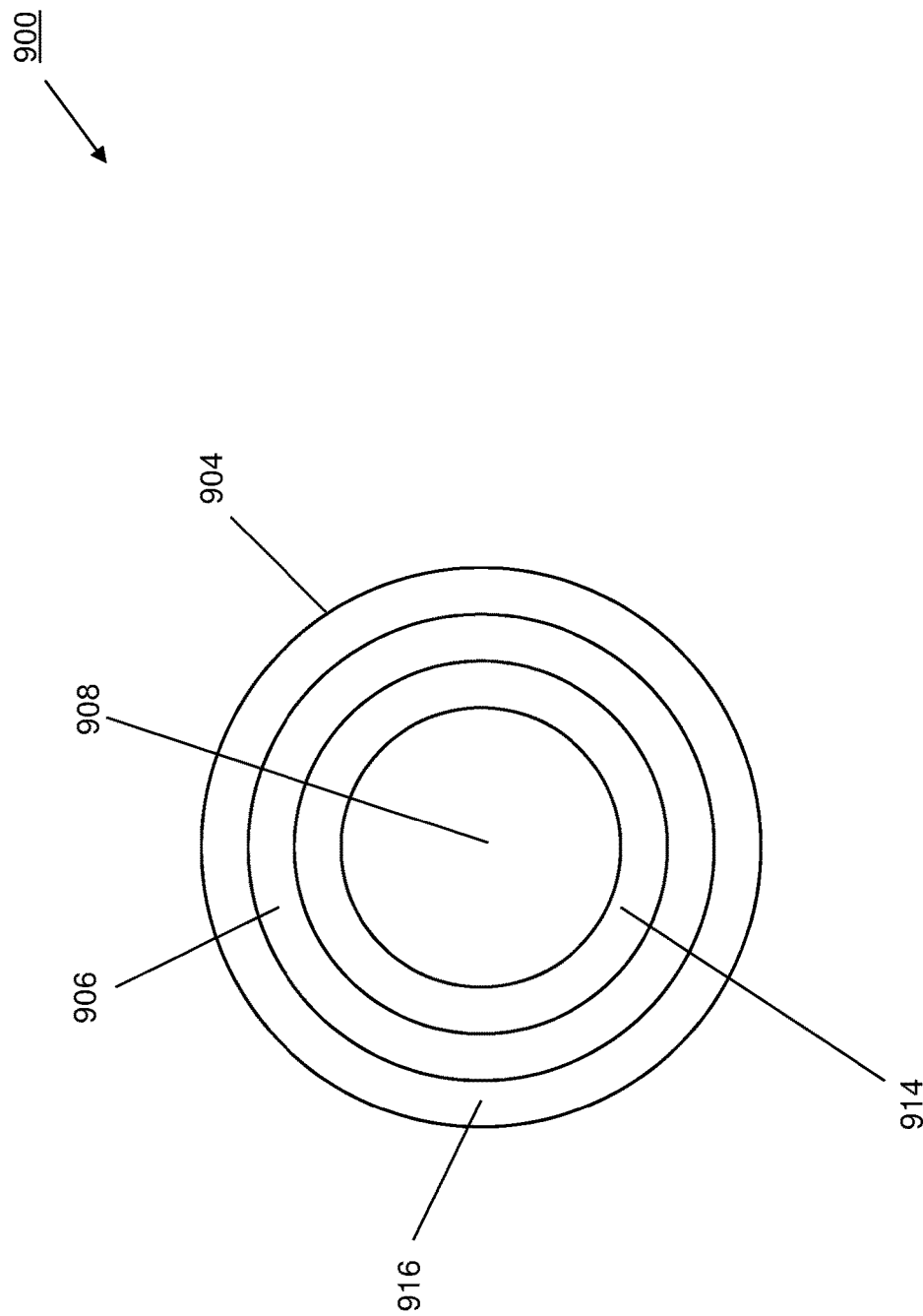
FIG. 9A is a schematic view illustrating an embodiment of the hybrid management cable of FIG. 6.
Figure 9B:
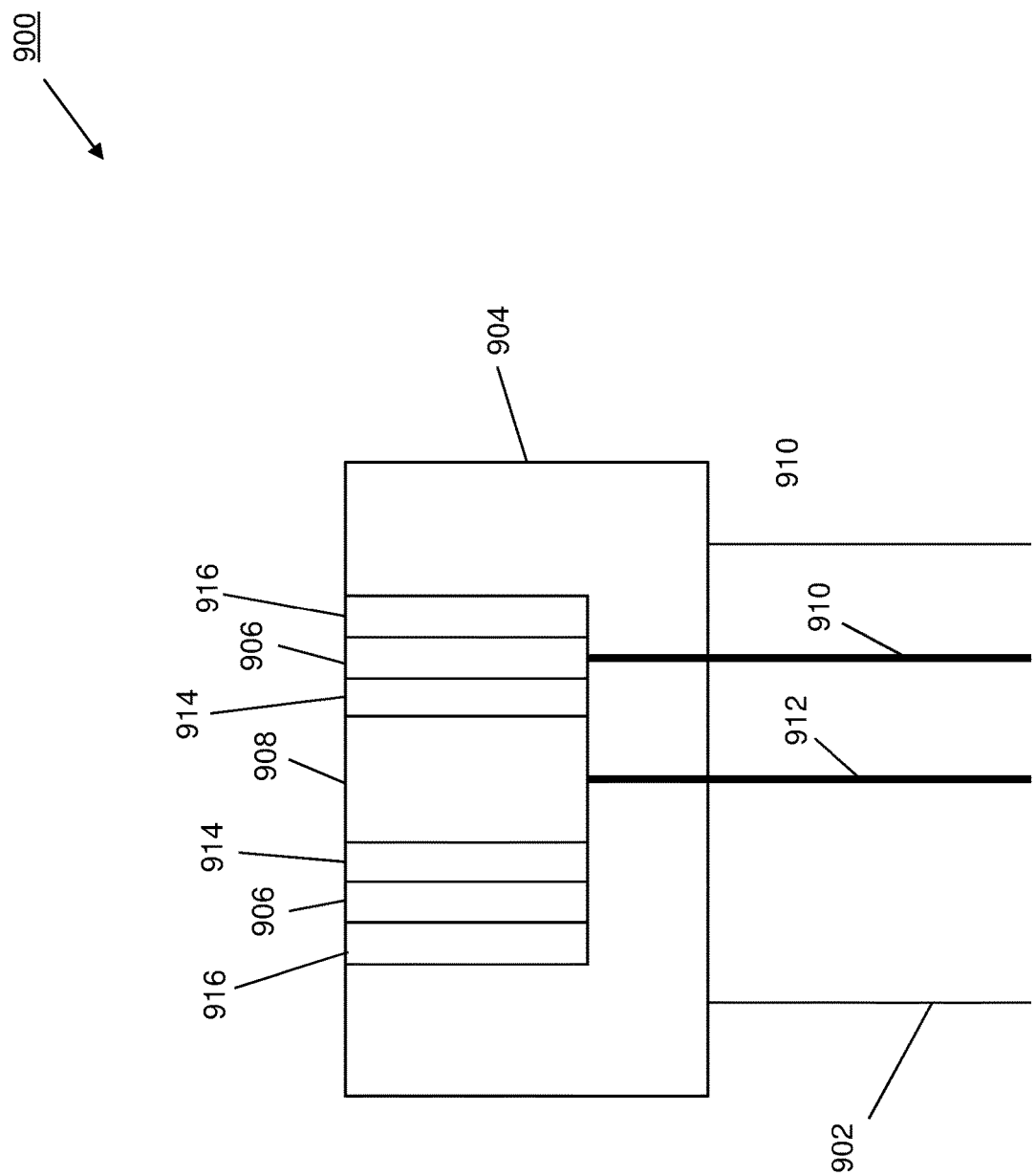
FIG. 9B is a schematic view illustrating an embodiment of the hybrid management cable of FIG. 6.

With reference to FIGS. 9A and 9B, an embodiment of a hybrid management cable 900 is illustrated that may provide the hybrid management cable 600 discussed above with reference to FIG. 6. The hybrid management cable 900 includes a cable conduit 902 that may be the cable conduit 602 discussed above with reference to FIG. 6, and a cable connector 904 that may provide either of the cable connectors 604 and 606 discussed above with reference to FIG. 6. Furthermore, FIGS. 9A and 9B illustrate how the cable connector 904 may include a pair of cable sub-connectors 906 and 908, with a management data transmission medium 910 connected to the cable sub-connector 906 and extending through the cable conduit 902 along the length of the cable conduit 902, and a management data transmission medium 912 connected to the cable sub-connector 908 and extending through the cable conduit 902 along the length of the cable conduit 902. While not illustrated, one of skill in the art in possession of the present disclosure will recognize how the management data transmission mediums 910 and 912 may connect to corresponding cable sub-connectors on a cable connector that is included on the cable conduit 902 opposite the cable connector 904.

In the specific examples provided below, the cable sub-connector 906 may be provided by a tubular connector that is configured to transmit the Ethernet management data discussed below via its connected management data transmission medium 810 (e.g., a tubular data transmission medium in this example) and to the corresponding cable sub-connector on the opposite end the cable conduit 902, while the cable sub-connector 908 may be provided by a cylindrical connector that is positioned within the tubular connector that provides the cable sub-connector 906 and that is configured to transmit the serial/console management data discussed below via its connected management data transmission medium 912 (e.g., a tubular data transmission medium in this example) and to the corresponding cable sub-connector on the opposite end the cable conduit 902. Furthermore, FIGS. 9A and 9B illustrate how the tubular connector that provides the cable sub-connector 908 (as well as the connected tubular data transmission medium 912 in this example) may be separated from the cylindrical connector that provides the cable sub-connector 906 (as well as the connected cylindrical data transmission medium 910 in this example) by a tubular insulator 914 (which may extend through the cable conduit 902 between the tubular data transmission medium 912 and the cylindrical data transmission medium 910), and how a tubular insulator 916 may surround the tubular connector that provides the cable sub-connector 908 (as well as the connected tubular data transmission medium 912 in this example) as well.

Figure 10:
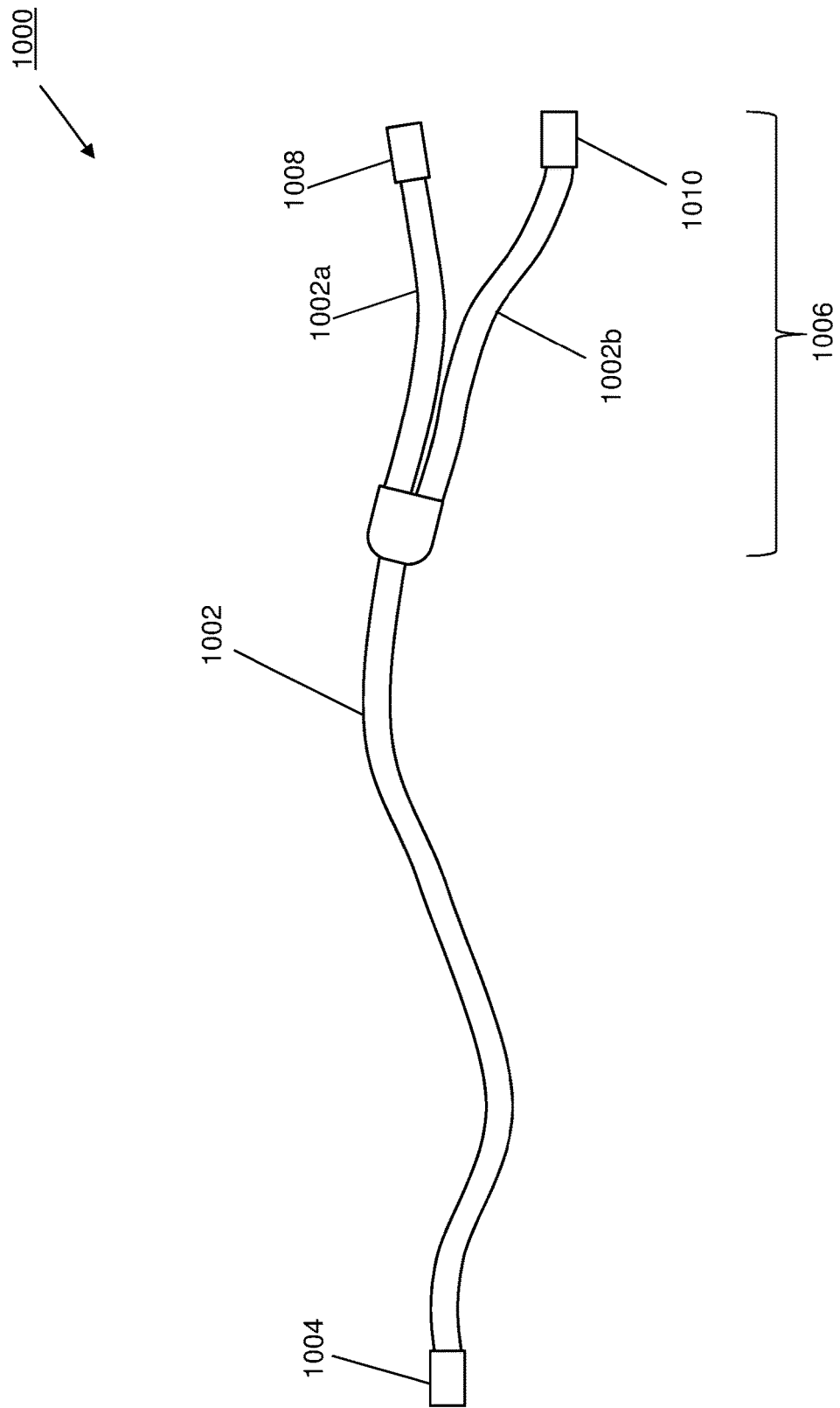
FIG. 10 is a schematic view illustrating an embodiment of a hybrid management cable that may be provided in the hybrid management switch system of FIG. 2.

Referring now to FIG. 10, an embodiment of a hybrid management cable 1000 is illustrated that may be utilized in the hybrid management switch system 200 discussed above with reference to FIG. 2. In the illustrated embodiment, the hybrid management cable 1000 includes a cable conduit 1002 that may be provided in a variety of cable lengths that would be apparent to one of skill in the art in possession of the present disclosure, with a hybrid management cable connector 1004 located on a first end of the cable conduit 1002, and with a "breakout" portion 1006 on a second end of the cable conduit 1002 that is opposite the hybrid management cable connector 1004 and that includes a first sub-cable 1002a having a first conventional cable connector 1008, and a second sub-cable 1002b having a second conventional cable connector 1010. Similarly as discussed above, the hybrid management cable connector 1004 may include a pair of cable sub-connectors that may be provided using different connector technology in different embodiments (e.g., the embodiments discussed above in FIGS. 7A/7B and 8A/8B).

However, the first conventional cable connector 1008 and second conventional cable connector 1010 may include conventional single connectors that may correspond to the cable sub-connectors on the hybrid management cable connector 1004. For example, when the hybrid management cable connector 1004 includes Ethernet connectors as its cable sub-connectors connectors (e.g., as illustrated in FIGS. 7A and 7B), the first conventional cable connector 1008 and second conventional cable connector 1010 may be Ethernet connectors that connect to those cable sub-connectors via respective data transmission mediums that extend through the first sub-cable 1002a and the second sub-cable 1002b. Similarly, when the hybrid management cable connector 1004 includes an Ethernet connector and a USB connector as its cable sub-connectors (e.g., as illustrated in FIGS. 8A and 8B), the first conventional cable connector 1008 may be an Ethernet connector that connects to the cable sub-connector provided by an Ethernet connector via a data transmission medium that extends through the first sub-cable 1002a, and the second conventional cable connector 1010 may be a USB connector that connects to the cable sub-connector provided by an USB connector via a data transmission medium that extends through the second sub-cable 1002b. As such, one of skill in the art in possession of the present disclosure will appreciate that the hybrid management cable 1000 described herein provides an example of a hybrid management cable that may be utilized with the switch device 206 and server devices 208a-208c that are provided with conventional connectors.

Figure 11:
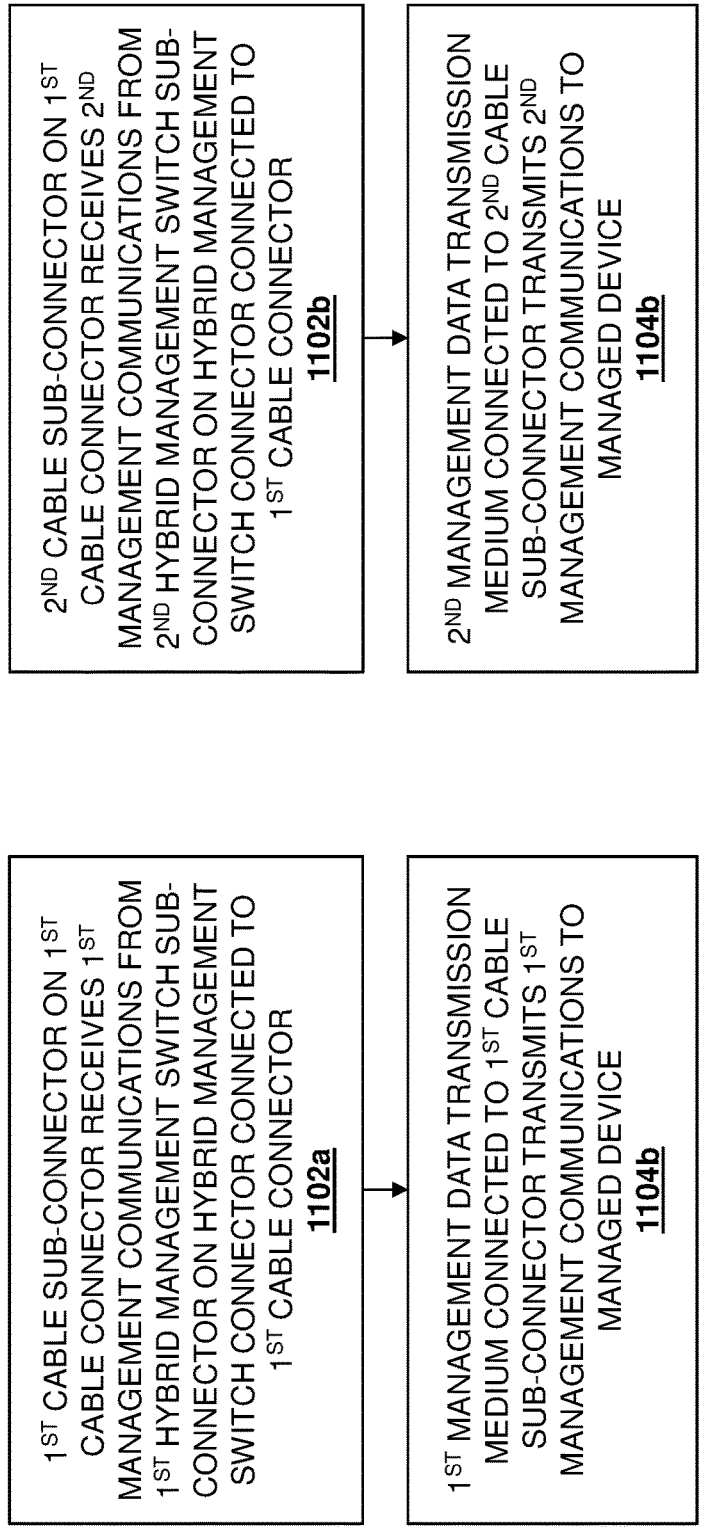
FIG. 11 is a flow chart illustrating an embodiment of a method for providing hybrid management.

Referring now to FIG. 11, an embodiment of a method 1100 for providing hybrid management is illustrated. As discussed below, the systems and methods of the present disclosure provides hybrid management switch connectors on a hybrid management switch device that are each configured to transmit different management communications, along with a hybrid management cable having a hybrid management cable connecter that may be connected to one of the hybrid management switch connectors on the hybrid management switch device, and may then receive the different management communications from that hybrid management connector and transmit them over respective management data transmission mediums that extend through the hybrid management cable. For example, the hybrid management cable of the present disclosure may include a cable connector having a first cable sub-connector and a second cable sub-connector, The cable connector connects to a hybrid management switch connector on a hybrid management switch and, in response, engages the first cable sub-connector with a first hybrid management switch sub-connector on the hybrid management switch connector, and engages the second cable sub-connector with a second hybrid management switch sub-connector on the hybrid management switch connector. A cable conduit extends from the cable connector. A first management data transmission medium is connected to the first cable sub-connector, located in the cable conduit, and extends along the length of the cable conduit. A second management data transmission medium is connected to the second cable sub-connector, located in the cable conduit and isolated from the first management data transmission medium, and extends along the length of the cable conduit. As such, a single hybrid management cable may be provided between a single hybrid management switch device and any server device, "data network" switch device, or storage system in its rack, thus reducing the number of management switch devices and management cables utilized in that rack.

As will be appreciate by one of skill in the art in possession of the present disclosure, the method 1100 illustrated in FIG. 11 includes blocks 1102*a* and 1104*a* that provide for the transmission of first management communications (e.g., Ethernet management communications) from the hybrid management switch device of the present disclosure and over the hybrid management cable of the present disclosure, as well as blocks 1102*b* and 1104*b* that provide for the transmission of second management communications (e.g., serial/console management communications) from the hybrid management switch device of the present disclosure and over the hybrid management cable of the present disclosure, and the blocks 1102*a*/1104*a* and 1102*b*/1104 may be performed simultaneously or at different times while remaining within the scope of the present disclosure. Furthermore, while not discussed below in detail, one of skill in the art in possession of the present disclosure will appreciate from the discussion below how first management communications (e.g., Ethernet management communications) may be received by the hybrid management switch device of the present disclosure via the hybrid management cable of the present disclosure, and second management communications (e.g., serial/console management communications) may be received by the hybrid management switch device of the present disclosure via the hybrid management cable of the present disclosure, while remaining within the scope of the present disclosure as well.

Figure 12:
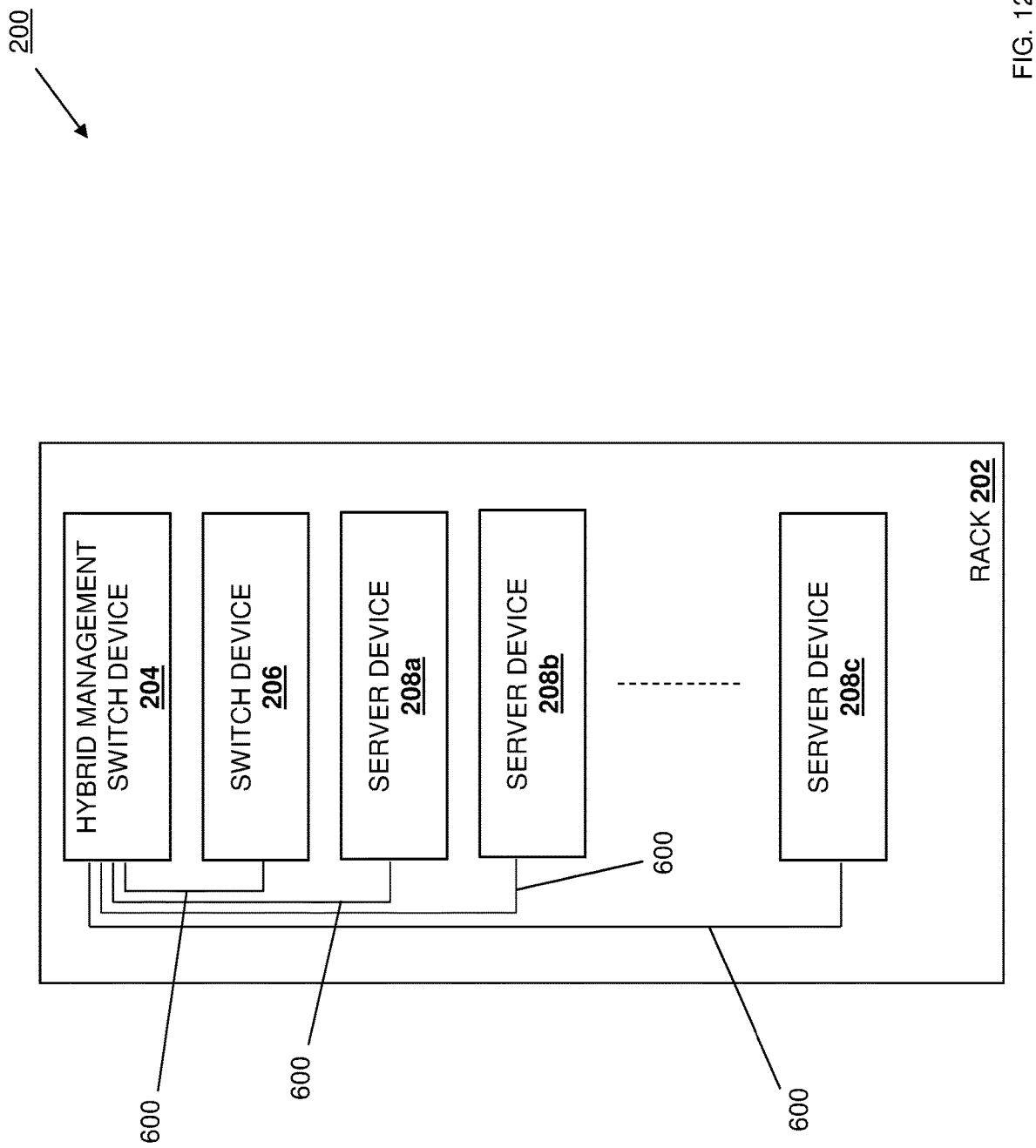
FIG. 12 is a schematic view illustrating an embodiment of the hybrid management switch system of FIG. 2 and hybrid management cables of FIG. 6 provided during the method of FIG. 11.

With reference to FIG. 12, in some embodiments and prior to the method 1100, the switch device 206 and the server devices 208*a*-208*c* may be connected to the hybrid management switch device 204 using the hybrid management cable 600 of FIG. 6. As such, one of skill in the art in possession of the present disclosure will appreciate that the embodiment illustrated in FIG. 12 provides hybrid managed device connectors on the switch device 206 and the server devices 208*a*-208*c* that are substantially similar to the hybrid management switch connectors on the hybrid management switch device 204, and thus each of those hybrid managed device connectors may include a pair hybrid managed device sub-connector similarly to the hybrid management switch connectors 304-334 discussed above with reference to FIGS. 3A and 3B, the hybrid management switch connectors 404-434 discussed above with reference to FIGS. 4A and 4B, and/or the hybrid management switch connectors 404-434 discussed above with reference to FIGS. 5A and 5B.

Thus, each of the switch device 206 and the server devices 208*a*-208*c* ("managed devices") may be connected to the hybrid management switch device 204 by a respective hybrid management cable 600 by connecting the cable connector 604 on that hybrid management cable 600 to a hybrid management switch connector on the hybrid management switch device 204, and connecting the cable connector 606 on that hybrid management cable 600 to a hybrid managed device connector on that managed device. Furthermore, one of skill in the art in possession of the present disclosure will recognize that the connection of the cable connectors 604 and 606 on the hybrid management cable 600 to a corresponding hybrid management switch connector and hybrid managed device connector will operate to connect the pair of cable sub-connectors in the cable connector 604 to the hybrid management switch sub-connectors in the hybrid management switch connector, as well as connect the pair of cable sub-connectors in the cable connector 606 to the hybrid managed device sub-connectors in the hybrid managed device connector.

Figure 13:
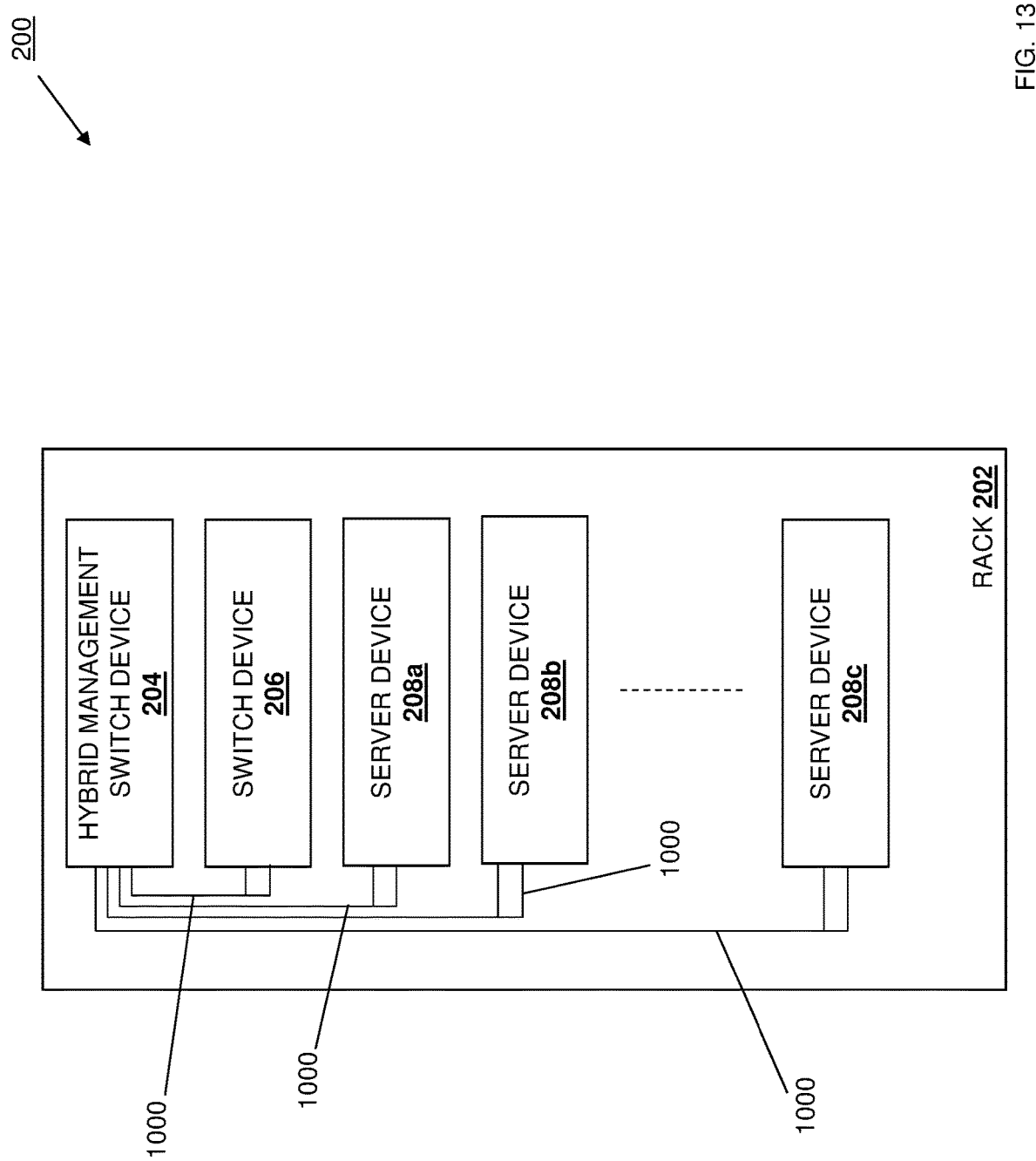
FIG. 13 is a schematic view illustrating an embodiment of the hybrid management switch system of FIG. 2 and hybrid management cables of FIG. 10 provided during the method of FIG. 11.

Similarly, with reference to FIG. 13, in some embodiments and prior to the method 1100, the switch device 206 and the server devices 208*a*-208*c* may be connected to the hybrid management switch device 204 using the hybrid management cable 1000 of FIG. 10. As such, one of skill in the art in possession of the present disclosure will appreciate that the embodiment illustrated in FIG. 13 provides conventional managed device connectors on the switch device 206 and the server devices 208*a*-208*c*. Thus, each of the switch device 206 and the server devices 208*a*-208*c* ("managed devices") may be connected to the hybrid management switch device 204 by a respective hybrid management cable 1000 by connecting the cable connector 604 on that hybrid management cable 600 to a hybrid management switch connector on the hybrid management switch device 204, and connecting the cable connectors 1008 and 1010 on that hybrid management cable 1000 to respective conventional managed device connectors on that managed device. Furthermore, one of skill in the art in possession of the present disclosure will recognize that the connection of the cable connector 1004 on the hybrid management cable 1000 to a corresponding hybrid management switch connector will operate to connect the pair of cable sub-connectors in the cable connector 604 to the hybrid management switch sub-connectors in the hybrid management switch connector. Furthermore, while FIGS. 12 and 13 illustrate separate embodiments that use either all hybrid management cables 600 or all hybrid management cables 1000, one of skill in the art in possession of the present disclosure will recognize that embodiments that use combinations of the hybrid management cables 600 and 1000 will fall within the scope of the present disclosure as well.

The method 1100 may begin at block 1102*a* where a first cable sub-connector on a first cable connector receives first management communications from a first hybrid management switch sub-connector on a hybrid management switch connector connected to the first cable connector. In an embodiment, at block 1102*a*, the processing system in the hybrid management switch device 204 (e.g., the processing systems 303, 403, or 503 discussed above) may generate and transmit first management communications (e.g., Ethernet management communications) via a hybrid management switch sub-connector in a hybrid management switch connector (e.g., the hybrid management switch sub-connector 304*a* in the hybrid management switch connector 304, the hybrid management switch sub-connector 404*a* in the hybrid management switch connector 404, or the hybrid management switch sub-connector 504a in the hybrid management switch connector 504). As such, a cable sub-connector on a cable connector on the hybrid management cable that is connected to the hybrid management switch connector (e.g., the cable sub-connector 706 on the cable connector 604/704 on the hybrid management cable 600/700 that is connected to the hybrid management switch connector 304, the cable sub-connector 806 on the cable connector 604/804 on the hybrid management cable 600/800 that is connected to the hybrid management switch connector 404, or the cable sub-connector 906 on the cable connector 604/904 on the hybrid management cable 600/900 that is connected to the hybrid management switch connector 504) may receive the first management communications at block 1102a (e.g., due to the engagement of that cable sub-connector on the cable connector and the hybrid management switch sub-connector on the hybrid management switch connector).

The method 1100 may also begin at block 1102b where a second cable sub-connector on the first cable connector receives second management communications from a second hybrid management switch sub-connector on the hybrid management switch connector connected to the first cable connector. In an embodiment, at block 1102b, the processing system in the hybrid management switch device 204 (e.g., the processing systems 303, 403, or 503 discussed above) may generate and transmit second management communications (e.g., serial/console management communications) via a hybrid management switch sub-connector in a hybrid management switch connector (e.g., the hybrid management switch sub-connector 304b in the hybrid management switch connector 304, the hybrid management switch sub-connector 404b in the hybrid management switch connector 404, or the hybrid management switch sub-connector 504b in the hybrid management switch connector 504). As such, a cable sub-connector on a cable connector on the hybrid management cable that is connected to the hybrid management switch connector (e.g., the cable sub-connector 708 on the cable connector 604/704 on the hybrid management cable 600/700 that is connected to the hybrid management switch connector 304, the cable sub-connector 808 on the cable connector 604/804 on the hybrid management cable 600/800 that is connected to the hybrid management switch connector 404, or the cable sub-connector 908 on the cable connector 604/904 on the hybrid management cable 600/900 that is connected to the hybrid management switch connector 504) may receive the second management communications at block 1102b (e.g., due to the engagement of that cable sub-connector on the cable connector and the hybrid management switch sub-connector on the hybrid management switch connector).

The method 1100 may proceed from block 1102a to block 1104a where a first management data transmission medium connected to the first cable sub-connector transmits the first management communications to a managed device. In an embodiment, at block 1104a, a first management data transmission medium in the hybrid management cable (e.g., the first management data transmission medium 710 in the hybrid management cable 600/700, the first management data transmission medium 810 in the hybrid management cable 600/800, or the first management data transmission medium 910 in the hybrid management cable 600/900) may transmit the first management communications received from the first cable sub-connector to a managed device. As will be appreciated by one of skill in the art in possession of the present disclosure, in embodiments like that illustrated in FIG. 12 in which the hybrid management cables 600 are utilized, transmission of the first management communications via the first management data transmission medium will reach the corresponding cable sub-connector on the hybrid management cable connector 604 connected to a managed device (e.g., the switch device 206 or the server devices 208a-208c) and be transmitted to the managed device via a hybrid managed device sub-connector included in a hybrid managed device connector on that managed device.

Furthermore, one of skill in the art in possession of the present disclosure will appreciate that, in embodiments like that illustrated in FIG. 13 in which the hybrid management cables 1000 are utilized, transmission of the first management communications via the first management data transmission medium will reach the conventional management data connector 1008 connected to a managed device (e.g., the switch device 206 or the server devices 208a-208c) and be transmitted to the managed device via a conventional managed device connector on that managed device.

The method 1100 may also proceed from block 1102b to block 1104b where a second management data transmission medium connected to the second cable sub-connector transmits the second management communications to the managed device. In an embodiment, at block 1104b, a second management data transmission medium in the hybrid management cable (e.g., the second management data transmission medium 712 in the hybrid management cable 600/700, the second management data transmission medium 812 in the hybrid management cable 600/800, or the second management data transmission medium 912 in the hybrid management cable 600/900) may transmit the second management communications received from the second cable sub-connector to a managed device. As will be appreciated by one of skill in the art in possession of the present disclosure, in embodiments like that illustrated in FIG. 12 in which the hybrid management cables 600 are utilized, transmission of the second management communications via the second management data transmission medium will reach the corresponding cable sub-connector on the hybrid management cable connector 604 connected to a managed device (e.g., the switch device 206 or the server devices 208a-208c) and be transmitted to the managed device via a hybrid managed device sub-connector included in a hybrid managed device connector on that managed device.

Furthermore, one of skill in the art in possession of the present disclosure will appreciate that, in embodiments like that illustrated in FIG. 13 in which the hybrid management cables 1000 are utilized, transmission of the second management communications via the second management data transmission medium will reach the conventional management data connector 1010 connected to a managed device (e.g., the switch device 206 or the server devices 208a-208c) and be transmitted to the managed device via a conventional managed device connector on that managed device.

Thus, systems and methods have been described that provide hybrid management switch connectors on a hybrid management switch device that are each configured to transmit both Ethernet management communications and serial/console management communications, along with a hybrid management cable having a hybrid management cable connecter that may be connected to one of the hybrid management switch connectors on the hybrid management switch device, and may then receive the Ethernet management communications and serial/console management communications from that hybrid management connector and transmit them over respective management data transmission mediums that extend through the hybrid management cable. For example, the hybrid management cable of the present disclosure may include a cable connector having a first cable sub-connector and a second cable sub-connector, The cable connector connects to a hybrid management switch connector on a hybrid management switch and, in response, engages the first cable sub-connector with a first hybrid management switch sub-connector on the hybrid management switch connector, and engages the second cable sub-connector with a second hybrid management switch sub-connector on the hybrid management switch connector. A cable conduit extends from the cable connector. A first management data transmission medium is connected to the first cable sub-connector, located in the cable conduit, and extends along the length of the cable conduit. A second management data transmission medium is connected to the second cable sub-connector, located in the cable conduit and isolated from the first management data transmission medium, and extends along the length of the cable conduit. As such, a single hybrid management cable may be provided between a single hybrid management switch device and any server device, "data network" switch device, or storage system in its rack, thus reducing the number of management switch devices and management cables utilized in that rack.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A hybrid management cable, comprising:
a hybrid management switch device;
a first cable connector including a first cable sub-connector and a second cable sub-connector, wherein the first cable connector is configured to connect to a hybrid management switch connector on the hybrid management switch and, in response:
engage the first cable sub-connector with a first hybrid management switch sub-connector included on the hybrid management switch connector; and
engage the second cable sub-connector with a second hybrid management switch sub-connector included on the hybrid management switch connector;
a cable conduit extending from the first cable connector;
an Ethernet management data transmission medium that is connected to the first cable sub-connector, that is located in the cable conduit, and that extends along the length of the cable conduit; and
a serial-console management data transmission medium, that is connected to the second cable sub-connector, that is located in the cable conduit and isolated from the Ethernet management data transmission medium, and that extends along the length of the cable conduit, wherein the hybrid management switch device is configured, when the first cable connector is connected to the hybrid management switch connector, to:
perform Ethernet management operations on Ethernet management communications that are received via the Ethernet management data transmission medium and through the first cable sub-connector and the first hybrid management switch sub-connector; and
perform serial/console management operations on serial/console management communications that are received via the serial-console management data transmission medium and through the second cable sub-connector and the second hybrid management switch sub-connector.

2. The system of claim 1, wherein the first cable sub-connector and the second cable sub-connector are each Ethernet connectors.

3. The system of claim 1, wherein the first cable sub-connector is an Ethernet connector and the second cable sub-connector is a Universal Serial Bus (USB) connector.

4. The system of claim 1, wherein the Ethernet management data transmission medium is a tubular conductive element, and the serial/console management data transmission medium is a cylindrical conductive element that is positioned within the tubular conductive element.

5. The system of claim 1, further comprising:
a second cable connector that is located on the cable conduit opposite the first cable connector, wherein the second cable connector includes a third cable sub-connector that is connected to the Ethernet management data transmission medium, and a fourth cable sub-connector that is connected to the serial/console management data transmission medium, and wherein the second cable connector is configured to connect to a hybrid managed device connector on a hybrid managed device and, in response:
engage the third cable sub-connector with a first hybrid managed device sub-connector included on the hybrid managed device connector; and
engage the fourth cable sub-connector with a second hybrid managed device sub-connector included on the hybrid managed device connector.

6. The system of claim 1, further comprising:
a second cable connector that extends from the cable conduit opposite the first cable connector, that is connected to the Ethernet management data transmission medium, and that is configured to connect to a first managed device connector on a managed device; and
a third cable connector that extends from the cable conduit opposite the first cable connector, that is connected to the serial/console management data transmission medium, and that is configured to connect to a second managed device connector on the managed device.

7. An Information Handling System (IHS), comprising:
a processing system;
a hybrid management switch connector that is coupled to the processing system and that includes a first hybrid management switch sub-connector and a second hybrid management switch sub-connector;
a first cable connector including a first cable sub-connector and a second cable sub-connector, wherein the first cable connector is connected to the hybrid management switch connector to engage the first cable sub-connector with the first hybrid management switch sub-connector, and engage the second cable sub-connector with the second hybrid management switch sub-connector;
a cable conduit extending from the first cable connector;
an Ethernet management data transmission medium that is connected to the first cable sub-connector, that is located in the cable conduit, and that extends along the length of the cable conduit;
a serial/console management data transmission medium, that is connected to the second cable sub-connector, that is located in the cable conduit and isolated from the Ethernet management data transmission medium, and that extends along the length of the cable conduit; and a memory system that is coupled to the processing system and that includes instructions that, when executed by the processing system, cause the processing system to:
perform Ethernet management operations on Ethernet management communications that are received via the Ethernet management data transmission medium and through the first cable sub-connector and the first hybrid management switch sub-connector; and
perform serial/console management operations on serial/console management communications that are received via the serial/console management data transmission medium and through the second cable sub-connector and the second hybrid management switch sub-connector.

8. The IHS of claim 7, wherein the first hybrid management switch sub-connector, the second hybrid management switch sub-connector, the first cable sub-connector, and the second cable sub-connector, are each provided by Ethernet connectors.

9. The IHS of claim 7, wherein the first hybrid management switch sub-connector and the first cable sub-connector are each provided by Ethernet connectors, and the second hybrid management switch sub-connector and the second cable sub-connector are each provided by Universal Serial Bus (USB) connectors.

10. The IHS of claim 7, wherein the Ethernet management data transmission medium is a tubular conductive element, and the serial/console management data transmission medium is a cylindrical conductive element that is positioned within the tubular conductive element.

11. The IHS of claim 7, further comprising:
a second cable connector that is located on the cable conduit opposite the first cable connector, wherein the second cable connector includes a third cable sub-connector that is connected to the Ethernet management data transmission medium, and a fourth cable sub-connector that is connected to the serial/console management data transmission medium, and wherein the second cable connector is configured to connect to a hybrid managed device connector on a hybrid managed device and, in response:
engage the third cable sub-connector with a first hybrid managed device sub-connector included on the hybrid managed device connector; and
engage the fourth cable sub-connector with a second hybrid managed device sub-connector included on the hybrid managed device connector.

12. The IHS of claim 7, further comprising:
a second cable connector that extends from the cable conduit opposite the first cable connector, that is connected to the Ethernet management data transmission medium, and that is configured to connect to a first managed device connector on a managed device; and
a third cable connector that extends from the cable conduit opposite the first cable connector, that is connected to the serial/console management data transmission medium, and that is configured to connect to a second managed device connector on the managed device.

13. The IHS of claim 7, wherein the hybrid management switch device is a Top Of Rack (TOR) hybrid management switch device.

14. A method for providing hybrid management, comprising:
transmitting, by a hybrid management switch device, Ethernet management communications via a first hybrid management switch sub-connector that is included on a hybrid management switch connector;
receiving, via a first cable sub-connector that is included on a first cable connector from the first hybrid management switch sub-connector that is included on the hybrid management switch connector that is connected to the first cable connector, the Ethernet management communications;
transmitting, via an Ethernet management data transmission medium that is connected to the first cable sub-connector and that extends along the length of a cable conduit that extends from the first cable connector, the first management communications;
transmitting, by the hybrid management switch device, serial/console management communications via a second hybrid management switch sub-connector that is included on the hybrid management switch connector;
receiving, via a second cable sub-connector that is included on the first cable connector from the second hybrid management switch sub-connector that is included on the hybrid management switch connector, the serial/console management communications; and
transmitting, via a serial/console management data transmission medium that is connected to the second cable sub-connector and that extends along the length of the cable conduit in isolation from the first management data transmission medium, the serial/console management communications.

15. The method of claim 14, wherein the first hybrid management switch sub-connector, the second hybrid management switch sub-connector, the first cable sub-connector, and the second cable sub-connector, are each provided by Ethernet connectors.

16. The method of claim 14, wherein the first hybrid management switch sub-connector and the first cable sub-connector are each provided by Ethernet connectors, and the second hybrid management switch sub-connector and the second cable sub-connector are each provided by Universal Serial Bus (USB) connectors.

17. The method of claim 14, wherein the Ethernet management data transmission medium is a tubular conductive element, and the serial/console management data transmission medium is a cylindrical conductive element that is positioned within the tubular conductive element.

18. The method of claim 14, further comprising:
providing, via a third cable sub-connector that is connected to the Ethernet management data transmission medium and that is included on a second cable connector that is located on the cable conduit opposite the first cable connector, the Ethernet management communications to a first hybrid managed device sub-connector that is included on a hybrid managed device connector that is connected to the second cable connector; and
providing, via a fourth cable sub-connector that is connected to the serial/console management data transmission medium and that is included on the second cable connector, the serial/console management communications to a second hybrid managed device sub-connector that is included on the hybrid managed device connector.

19. The method of claim 14, further comprising:
providing, by a second cable connector that is connected to the Ethernet management data transmission medium and that extends from the cable conduit opposite the first cable connector, the Ethernet management communications to a first managed device connector on a managed device; and providing, by a third cable connector that is connected to the serial/console management data transmission medium and that extends from the cable conduit opposite the first cable connector, the serial/console management communications to a second managed device connector on the managed device.

20. The method of claim 14, wherein the hybrid management switch device is a Top Of Rack (TOR) hybrid management switch device.

* * * * *